US006911921B2

(12) United States Patent
Widmer

(10) Patent No.: US 6,911,921 B2
(45) Date of Patent: Jun. 28, 2005

(54) 5B/6B-T, 3B/4B-T AND PARTITIONED 8B/10B-T AND 10B/12B TRANSMISSION CODES, AND THEIR IMPLEMENTATION FOR HIGH OPERATING RATES

(75) Inventor: Albert X. Widmer, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 74 days.

(21) Appl. No.: 10/666,285

(22) Filed: Sep. 19, 2003

(65) Prior Publication Data

US 2005/0062621 A1 Mar. 24, 2005

(51) Int. Cl.$^7$ ............................................... H03M 7/00
(52) U.S. Cl. ............................................................. 341/58
(58) Field of Search ........................................ 341/58, 59

(56) References Cited

U.S. PATENT DOCUMENTS 4,486,739 A * 12/1984 Franaszek et al. ............. 341/59
5,387,911 A * 2/1995 Gleichert et al. ............. 341/95
6,496,540 B1 * 12/2002 Widmer ....................... 375/242

* cited by examiner

Primary Examiner—Howard Williams
(74) Attorney, Agent, or Firm—Ryan, Mason & Lewis, LLP; Robert M. Trepp, Esq.

(57) ABSTRACT

Techniques are disclosed for translating five-bit source vectors into six-bit coded vectors. A sixth bit having a default value is appended to the source vectors. Selected one to three individual source bits are complemented for a minority of the plurality of source vectors. The coded vectors are either disparity independent with a single representation or disparity dependent with a primary and an alternate representation, where the alternate representation is a complement of the primary representation. Additional techniques are disclosed for translating three-bit source vectors together with one or more control inputs, into nine four-bit coded vectors. A fourth bit having a default value is appended to the source vectors. A single individual bit is complemented for a minority of source vectors. The coded vectors are either disparity independent with a single representation or disparity dependent with a primary and an alternate representation, where the alternate representation is a complement of the primary representation. 8B/10B and 10B/12B encoding techniques are also disclosed.

27 Claims, 32 Drawing Sheets

| NAME | ABCDE K | INVERTED BITS | PRIMARY abcdei | ALTERNATE abcdei | DR CLASS | DR | DB CLASS | DB |
|---|---|---|---|---|---|---|---|---|
| D0 | 00000 0 | ADI | 100101 | | | ± | C'·D'·E'·K' | 0 |
| D1 | 10000 0 | CI | 101001 | | | ± | C'·D'·E'·K' | 0 |
| D2² | 01000 0 | EI | 010011 | | | ± | C'·D'·E'·K' | 0 |
| D3 | 11000 0 | I | 110001 | | | ± | C'·D'·E'·K' | 0 |
| D4 | 00100 0 | BI | 011001 | | | ± | ZB6 | 0 |
| D5 | 10100 0 | | 101000 | 010111 | PDRS6 | + | | - |
| D6 | 01100 0 | | 011000 | 100111 | PDRS6 | + | | - |
| D7 | 11100 0 | | 111000 | 000111 | NDRS6 | - | ZB6 | 0 |
| D8 | 00010 0 | BI | 010101 | | | ± | XB6 | 0 |
| D9 | 10010 0 | | 100100 | 011011 | PDRS6 | + | | - |
| D10 | 01010 0 | | 010100 | 101011 | PDRS6 | + | | - |
| D11 | 11010 0 | | 110100 | | | ± | XB6 | 0 |
| D12 | 00110 0 | | 001100 | 110011 | PDRS6 | + | | - |
| D13¹ | 10110 0 | | 101100 | | | ± | XB6 | 0 |
| D14¹ | 01110 0 | | 011100 | | | ± | XB6 | 0 |
| D15 | 11110 0 | ABI | 001101 | | | ± | ZB6 | 0 |
| D16² | 00001 0 | AI | 100011 | | | ± | XB6 | 0 |
| D17 | 10001 0 | | 100010 | 011101 | PDRS6 | + | | - |
| D18 | 01001 0 | | 010010 | 101101 | PDRS6 | + | | - |
| D19 | 11001 0 | | 110010 | | | ± | XB6 | 0 |
| D20 | 00101 0 | | 001010 | 110101 | PDRS6 | + | | - |
| D21 | 10101 0 | | 101010 | | | ± | XB6 | 0 |
| D22 | 01101 0 | | 011010 | | | ± | XB6 | 0 |
| D/K23 | 11101 x | | 111010 | 000101 | NDRS6 | - | | + |
| D24 | 00011 0 | | 000110 | 111001 | PDRS6 | + | | - |
| D25 | 10011 0 | | 100110 | | | ± | YB6 | 0 |
| D26 | 01011 0 | | 010110 | | | ± | YB6 | 0 |
| D/K27 | 11011 x | | 110110 | 001001 | NDRS6 | - | | + |
| D28 | 00111 0 | | 001110 | | | ± | YB6 | 0 |
| D/K29 | 10111 x | | 101110 | 010001 | NDRS6 | - | | + |
| D/K30 | 01111 x | | 011110 | 100001 | NDRS6 | - | | + |
| D31 | 11111 0 | ABDI | 001011 | | | ± | YB6 | 0 |
| K3 | 11000 1 | | 110000 | 001111 | PDRS6 | + | | - |

1. S1 = 1 FOR PDFS6·C·D·E'·(A≠B)
2. S2 = 1 FOR NDFS6·A'·C'·D'·(B≠E)

FIG. 5

| NAME | ABCDE K | INVERTED BITS | PRIMARY abcdei | ALTERNATE abcdei | DR CLASS | DR | DB CLASS | DB |
|---|---|---|---|---|---|---|---|---|
| D0 | 00000 0 | ADI | 100101 | | | ± | C'·D'·E'·K' | 0 |
| D1 | 10000 0 | CI | 101001 | | | ± | C'·D'·E'·K' | 0 |
| D2² | 01000 0 | EI | 010011 | | | ± | C'·D'·E'·K' | 0 |
| D3 | 11000 0 | I | 110001 | | | ± | C'·D'·E'·K' | 0 |
| D4 | 00100 0 | BI | 011001 | | | ± | ZB6 | 0 |
| D5 | 10100 0 | | 101000 | 010111 | PDRS6 | + | | - |
| D6 | 01100 0 | | 011000 | 100111 | PDRS6 | + | | - |
| D7 | 11100 0 | | 111000 | 000111 | NDRS6 | - | ZB6 | 0 |
| D8 | 00010 0 | BI | 010101 | | | ± | XB6 | 0 |
| D9 | 10010 0 | | 100100 | 011011 | PDRS6 | + | | - |
| D10 | 01010 0 | | 010100 | 101011 | PDRS6 | + | | - |
| D11 | 11010 0 | | 110100 | | | ± | XB6 | 0 |
| D12 | 00110 0 | | 001100 | 110011 | PDRS6 | + | | - |
| D13¹ | 10110 0 | | 101100 | | | ± | XB6 | 0 |
| D14¹ | 01110 0 | | 011100 | | | ± | XB6 | 0 |
| D15 | 11110 0 | ABI | 001101 | | | ± | ZB6 | 0 |
| D16² | 00001 0 | AI | 100011 | | | ± | XB6 | 0 |
| D17 | 10001 0 | | 100010 | 011101 | PDRS6 | + | | - |
| D18 | 01001 0 | | 010010 | 101101 | PDRS6 | + | | - |
| D19 | 11001 0 | | 110010 | | | ± | XB6 | 0 |
| D20 | 00101 0 | | 001010 | 110101 | PDRS6 | + | | - |
| D21 | 10101 0 | | 101010 | | | ± | XB6 | 0 |
| D22 | 01101 0 | | 011010 | | | ± | XB6 | 0 |
| D/K23 | 11101 x | | 111010 | 000101 | NDRS6 | - | | + |
| D24 | 00011 0 | | 000110 | 111001 | PDRS6 | + | | - |
| D25 | 10011 0 | | 100110 | | | ± | YB6 | 0 |
| D26 | 01011 0 | | 010110 | | | ± | YB6 | 0 |
| D/K27 | 11011 x | | 110110 | 001001 | NDRS6 | - | | + |
| D28 | 00111 0 | | 001110 | | | ± | YB6 | 0 |
| D/K29 | 10111 x | | 101110 | 010001 | NDRS6 | - | | + |
| D/K30 | 01111 x | | 011110 | 100001 | NDRS6 | - | | + |
| D31 | 11111 0 | ABDI | 001011 | | | ± | YB6 | 0 |
| K3 | 11000 1 | | 110000 | 001111 | PDRS6 | + | | - |

1. S1 = 1 FOR PDFS6·C'·D·E'·(A≠B)
2. S2 = 1 FOR NDFS6·A'·C'·D'·(B≠E)

FIG. 6

| NAME | FGHK | CODING CLASS | PRIMARY fghj | ALTERNATE fghj | DR CLASS | DR | DB CLASS | DB |
|---|---|---|---|---|---|---|---|---|
| Dx.0 | 000 0 | F'·G'·H', G'·H' | 0101 | | | ± | G'·H' | 0 |
| K3.0 | 000 1 | F'·G'·H', G'·H' | 0101 | 1010 | K·(F·G)' | + | G'·H' | 0 |
| Dx.1 | 100 0 | G'·H' | 1001 | | | ± | G'·H' | 0 |
| K3.1 | 100 1 | G'·H' | 1001 | 0110 | K·(F·G)' | + | G'·H' | 0 |
| Dx/K3.2 | 010 x | | 0100 | 1011 | F'·(G≠H) | + | | |
| Dx/K3.3 | 110 x | | 1100 | 0011 | F·G | − | F·(G≠H) | 0 |
| Dx/K3.4 | 001 x | | 0010 | 1101 | F'·(G≠H) | + | | |
| Dx.5 | 101 0 | | 1010 | | | ± | F·(G≠H) | 0 |
| K3.5 | 101 1 | | 1010 | 0101 | K·(F·G)' | + | F·(G≠H) | 0 |
| Dx.6 | 011 0 | | 0110 | | | ± | F'·G·H | 0 |
| K3.6 | 011 1 | | 0110 | 1001 | K·(F·G)' | + | F'·G·H | 0 |
| Dx/K3.P7 | 111 x | | 1110 | 0001 | F·G | − | | |
| Dx.A7[1] | 111 0 | F·G·H·S | 0111 | 1000 | F·G | − | | |
| Ky.A7[2] | 111 1 | F·G·H·Ky | 0111 | 1000 | F·G | − | | |

1. S1 = 1 FOR PDFS6·C·D·E'·(A≠B) + NDFS6·A'·C'·D'·(B≠E)
2. Ky IS RESTRICTED TO K23, K27, K29, K30 = K·E

FIG. 7

| NAME | ABCDE FGH K | PRIMARY (6B) DR abcdei fghi DB | ALTERNATE DR abcdei fghi DB |
|---|---|---|---|
| K3.0 | 11000 000 1 | + 110000 1010 - | - 001111 0101 + |
| K3.1 | 11000 100 1 | + 110000 0110 - | - 001111 1001 + |
| K3.2 | 11000 010 1 | + 110000 1011 0 | - 001111 0100 0 |
| K3.3 | 11000 110 1 | + 110000 1100 - | - 001111 0011 + |
| K3.4 | 11000 001 1 | + 110000 1101 0 | - 001111 0010 0 |
| K3.5 | 11000 101 1 | + 110000 0101 - | - 001111 1010 + |
| K3.6 | 11000 011 1 | + 110000 1001 - | - 001111 0110 + |
| K3.7 | 11000 111 1 | + 110000 1110 0 | - 001111 0001 0 |
| K23.7 | 11101 111 1 | - 111010 1000 0 | + 000101 0111 0 |
| K27.7 | 11011 111 1 | - 110110 1000 0 | + 001001 0111 0 |
| K29.7 | 10111 111 1 | - 101110 1000 0 | + 010001 0111 0 |
| K30.7 | 01111 111 1 | - 011110 1000 0 | + 100001 0111 0 |

FIG. 8

| NAME | ABCDE FGH K | PRIMARY (6B) DR abcdei fghi DB | ALTERNATE DR abcdei fghi DB |
|---|---|---|---|
| K11.7 | 11010 111 1 | + 110100 1000 - | - 001011 0111 + |
| K19.7 | 11001 111 1 | + 110010 1000 - | - 001101 0111 + |
| K21.7 | 10101 111 1 | + 101010 1000 - | - 010101 0111 + |
| K22.7 | 01101 111 1 | + 011010 1000 - | - 100101 0111 + |
| K25.7 | 10011 111 1 | + 100110 1000 - | - 011001 0111 + |
| K26.7 | 01011 111 1 | + 010110 1000 - | - 101001 0111 + |
| K28.7 | 00111 111 1 | + 001110 1000 - | + 110001 0111 + |

Pn1 = NDFS6aEnAueBaCueD
Pn2 = NDFS6aAnBueCaDueE
Pn3 = NDFS6aBnaCnaEaAueD
Pn4 = NDFS6aKaEn
Pn5 = PDFS6aAaBaCnaDaE
Pn6 = PDFS6aCaDaEaAueB
Pn7 = PDFS6aAaBaCaDn

| FIG. 9B |
|---|
| FIG. 9B cont. |

*FIG. 12 cont.*
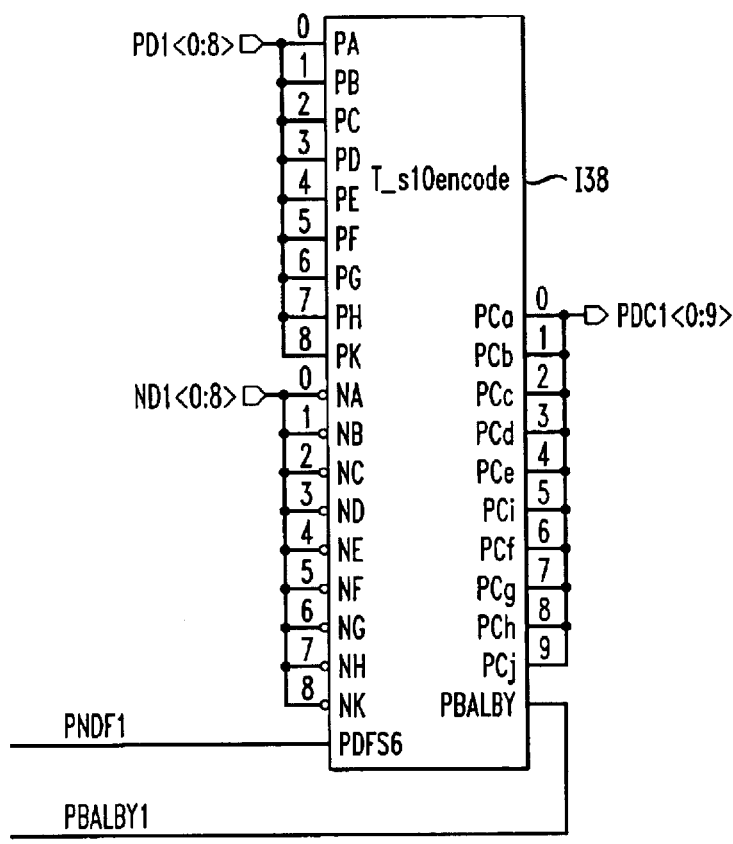
*FIG. 12A*
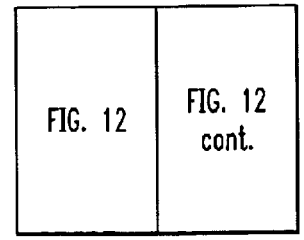
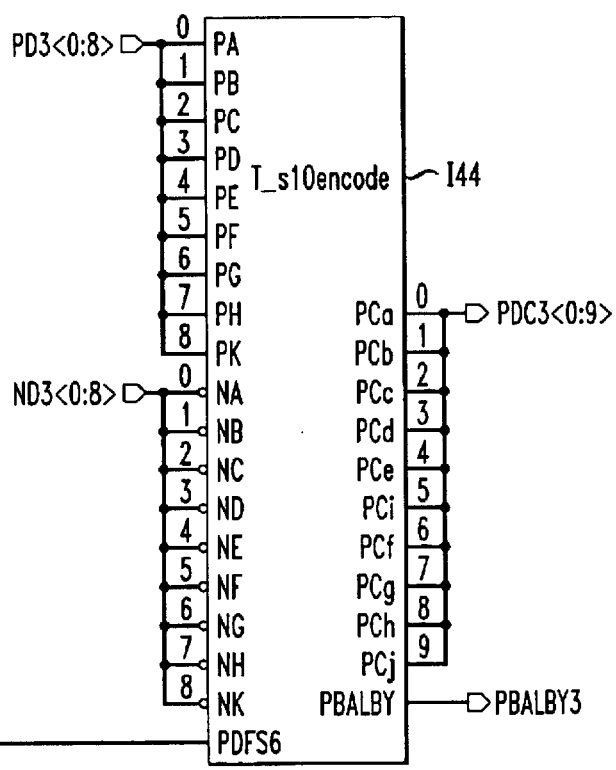

*FIG. 13 cont.*
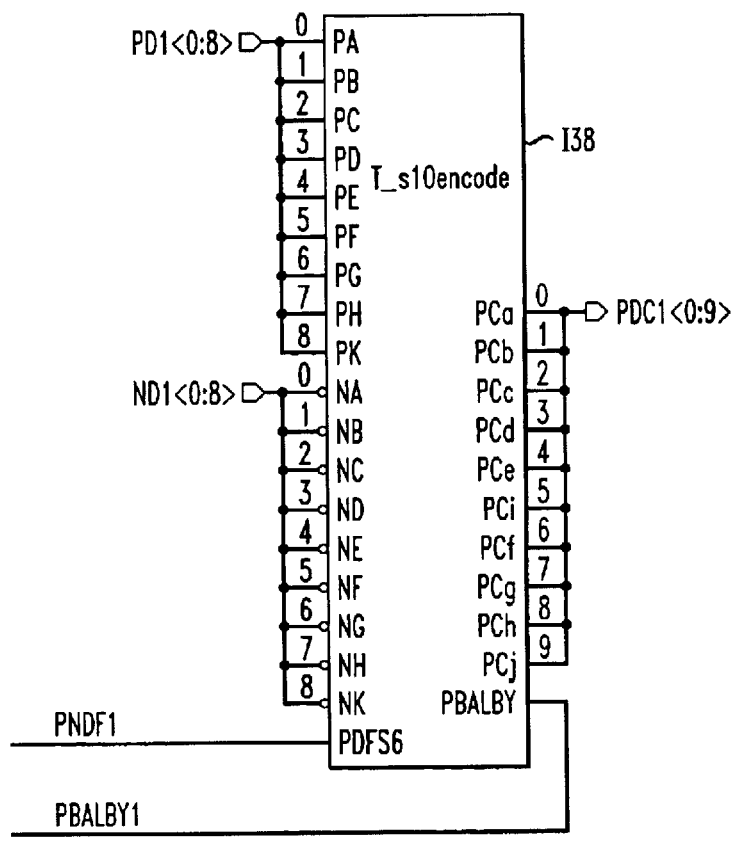
*FIG. 13A*
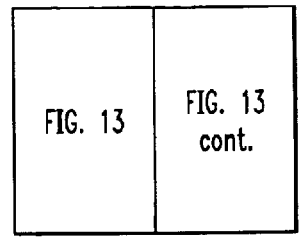
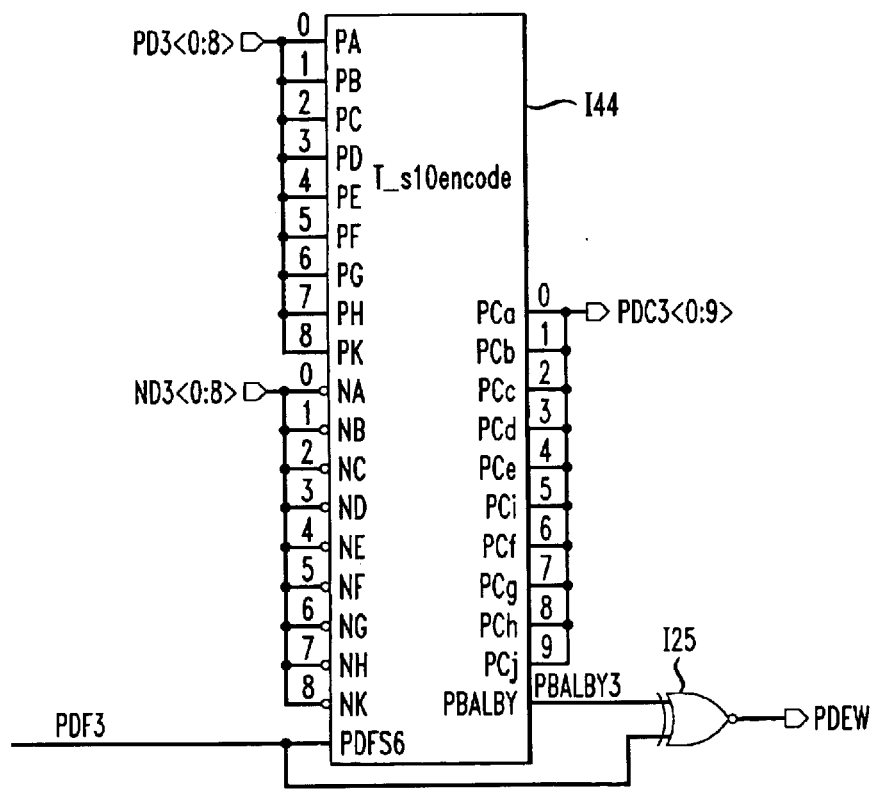

FIG. 14

| NAME | abcdei | DECODING CLASS | ABCDE K | DR CLASS | DR | DU CLASS | DU |
|---|---|---|---|---|---|---|---|
| D0P | 100101 | b'·i·(a≠c)·(d≠e) | 00000 0 |  | ± |  |  |
| D0P | 100101 | b'·i·(a·c'·d·e') | 00000 0 |  | ± |  |  |
| D1 | 101001 | a·b'·c·d'·e'·i | 10000 0 |  | ± |  |  |
| D2 | 010011 | a'·b·c'·d'·e·i | 01000 0 |  | ± |  |  |
| D3 | 110001 |  | 11000 0 |  | ± |  |  |
| D4 | 011001 | a'·b·e'·i·(c≠d) | 00100 0 |  | ± |  |  |
| D5P | 101000 |  | 10100 0 | PDRR6 | + | NDUR6 | - |
| D5A | 010111 | d·e·i | 10100 0 | NDRR6 | - | PDUR6 | + |
| D6P | 011000 |  | 01100 0 | PDRR6 | + | NDUR6 | - |
| D6A | 100111 | d·e·i | 01100 0 | NDRR6 | - | PDUR6 | + |
| D7P | 111000 |  | 11100 0 | NDRR6 | - | NDUR6 | - |
| D7A | 000111 | d·e·i | 11100 0 | PDRR6 | + | PDUR6 | + |
| D8 | 010101 | a'·b·e'·i·(c≠d) | 00010 0 |  | ± |  |  |
| D9P | 100100 |  | 10010 0 | PDRR6 | + | NDUR6 | - |
| D9A | 011011 | c·i·(a+b)·(d+e) | 10010 0 | NDRR6 | - | PDUR6 | + |
| D10P | 010100 |  | 01010 0 | PDRR6 | + | NDUR6 | - |
| D10A | 101011 | c·i·(a+b)·(d+e) | 01010 0 | NDRR6 | - | PDUR6 | + |
| D11 | 110100 |  | 11010 0 |  | ± |  |  |
| D12P | 001100 |  | 00110 0 | PDRR6 | + | NDUR6 | - |
| D12A | 110011 | a·b·i·(c+d+e) | 00110 0 | NDRR6 | - | PDUR6 | + |
| D13 | 101100 |  | 10110 0 |  | ± |  |  |
| D14 | 011100 |  | 01110 0 |  | ± |  |  |
| D15P | 001101 | b'·i·(a≠c)·(d≠e) | 11110 0 |  | ± |  |  |
| D15P | 001101 | a'·b'·c·i·(d≠e) | 11110 0 |  | ± |  |  |
| D16 | 100011 | b'·i·(a≠c)·(d≠e) | 00001 0 |  | ± |  |  |
| D17P | 100010 |  | 10001 0 | PDRR6 | + | NDUR6 | - |
| D17A | 011101 | c·i·(a+b)·(d+e) | 10001 0 | NDRR6 | - | PDUR6 | + |
| D18P | 010010 |  | 01001 0 | PDRR6 | + | NDUR6 | - |
| D18A | 101101 | c·i·(a+b)·(d+e) | 01001 0 | NDRR6 | - | PDUR6 | + |
| D19 | 110010 |  | 11001 0 |  | ± |  |  |
| D20P | 001010 |  | 00101 0 | PDRR6 | + | NDUR6 | - |
| D20A | 110101 | a·b·i·(c+d+e) | 00101 0 | NDRR6 | - | PDUR6 | + |
| D21 | 101010 |  | 10101 0 |  | ± |  |  |

| | | | | | | | | |
|---|---|---|---|---|---|---|---|---|
| D22 | 011010 | | 01101 0 | | ± | | | |
| D/K23P | 111010 | | 11101 x | NDRR6 | - | PDUR6 | + | |
| D/K23A | 000101 | a'·b'·e'·(c'+d') | 11101 x | PDRR6 | + | NDUR6 | - | |
| D24P | 000110 | | 00011 0 | PDRR6 | + | NDUR6 | - | |
| D24A | 111001 | a·b·i·(c+d+e) | 00011 0 | NDRR6 | - | PDUR6 | + | |
| D25 | 100110 | | 10011 0 | | ± | | | |
| D26 | 010110 | | 01011 0 | | ± | | | |
| D/K27P | 110110 | | 11011 x | NDRR6 | - | PDUR6 | + | |
| D/K27A | 001001 | a'·b'·e'·(c'+d') | 11011 x | PDRR6 | + | NDUR6 | - | |
| D28 | 001110 | | 00111 0 | | ± | | | |
| D/K29P | 101110 | | 10111 x | NDRR6 | - | PDUR6 | + | |
| D/K29A | 010001 | c'·d'·e'·(a'+b') | 10111 x | PDRR6 | + | NDUR6 | - | |
| D/K30P | 011110 | | 01111 x | NDRR6 | - | PDUR6 | + | |
| D/K30A | 100001 | c'·d'·e'·(a'+b') | 01111 x | PDRR6 | + | NDUR6 | - | |
| D31P | 001011 | b'·i·(a≠c)·(d≠e) | 11111 0 | | ± | | | |
| D31P | 001011 | a'·b'·c·i·(d≠e) | 11111 0 | | ± | | | |
| D31P | 001011 | b'·i·(a'·c·d'·e) | 11111 0 | | ± | | | |
| K3P | 110000 | c'·d'·e'·i' | 11000 1 | PDRR6 | + | NDUR6 | - | |
| K3A | 001111 | d·e·i | 11000 1 | NDRR6 | - | PDUR6 | + | |

FIG. 16

| NAME | fghj | DECODING CLASS | FGH K^a | DR CLASS | DR | DU CLASS | DU |
|---|---|---|---|---|---|---|---|
| Dx/K3.0P | 0101 | m5 | 000 x | | ± | | |
| K3.0A | 1010 | m0 | 000 1 | | | | |
| Dx/K3.1P | 1001 | | 100 x | | ± | | |
| K3.1A | 0110 | m0, m0·(f·h)', m0 | 100 1 | | | | |
| Dx/K3.2P | 0100 | | 010 x | PDR4 | + | | - |
| Dx/K3.2A | 1011 | m2, m5, g'·h·j | 010 x | NDR4 | - | | + |
| Dx/K3.3P | 1100 | | 110 x | NDR4 | - | | - |
| Dx/K3.3A | 0011 | m2, m5, g'·h·j | 110 x | PDR4 | + | | + |
| Dx/K3.4P | 0010 | | 001 x | PDR4 | + | | - |
| Dx/K3.4A | 1101 | m1, m5, m1 + m4 | 001 x | NDR4 | - | | + |
| Dx/K3.5P | 1010 | | 101 x | | ± | | |
| K3.5A | 0101 | m0, m0·(f·h)', m0 | 101 1 | | | | |
| Dx/K3.6P | 0110 | | 011 x | | ± | | |
| K3.6A | 1001 | m0, m0·(f·h)', m0 | 011 1 | | | | |
| Dx/K3.7P | 1110 | | 111 x | NDR4 | - | | + |
| Dx/K3.7A | 0001 | m1, m4, m1 + m4 | 111 x | PDR4 | + | | - |
| Dx/Ky.7P | 0111 | m2 | 111 x | NDR4 | - | | + |
| Dx/Ky.7A | 1000 | m4, m1 + m4 | 111 x | PDR4 | + | | - | a-Ky.7 = (e≠i)·(i=g=h=j)

FIG. 23

| NAME | ABCDE K | INVERTED BITS | PRIMARY abcdei | ALTERNATE abcdei | DR CLASS | DR | DB CLASS | DB |
|---|---|---|---|---|---|---|---|---|
| K0 | 00000 1 | ADI | 100101 | 011010 | NDRS6 | - | (A·B)'·C'·D'·E' | 0 |
| K1 | 10000 1 | CI | 101001 | 010110 | NDRS6 | - | (A·B)'·C'·D'·E' | 0 |
| K2 | 01000 1 | EI | 010011 | 101100 | NDRS6 | - | (A·B)'·C'·D'·E' | 0 |
| K3 | 11000 1 |  | 110000 | 001111 | PDRS6 | + |  | - |
| K4 | 00100 1 | BI | 011001 | 100110 | NDRS6 | - | ZB6 | 0 |
| D/K5 | 10100 x |  | 101000 | 010111 | PDRS6 | + |  | - |
| D/K6 | 01100 x |  | 011000 | 100111 | PDRS6 | + |  | - |
| D/K7 | 11100 x |  | 111000 | 000111 | NDRS6 | - | ZB6 | 0 |
| K8 | 00010 1 | BI | 010101 | 101010 | NDRS6 | - | XB6 | 0 |
| D/K9 | 10010 x |  | 100100 | 011011 | PDRS6 | + |  | - |
| D/K10 | 01010 x |  | 010100 | 101011 | PDRS6 | + |  | - |
| K11 | 11010 1 |  | 110100 | 001011 | NDRS6 | - | XB6 | 0 |
| D/K12 | 00110 x |  | 001100 | 110011 | PDRS6 | + |  | - |
| K13 | 10110 1 |  | 101100 | 010011 | NDRS6 | - | XB6 | 0 |
| K14 | 01110 1 |  | 011100 | 100011 | NDRS6 | - | XB6 | 0 |
| K15 | 11110 1 |  | 111100 | 000011 | NDRS6 | - |  | + |
| K16 | 00001 1 | AI | 100011 | 011100 | NDRS6 | - | XB6 | 0 |
| D/K17 | 10001 x |  | 100010 | 011101 | PDRS6 | + |  | - |
| D/K18 | 01001 x |  | 010010 | 101101 | PDRS6 | + |  | - |
| K19 | 11001 1 |  | 110010 | 001101 | NDRS6 | - | XB6 | 0 |
| D/K20 | 00101 x |  | 001010 | 110101 | PDRS6 | + |  | - |
| K21 | 10101 1 |  | 101010 | 010101 | NDRS6 | - | XB6 | 0 |
| K22 | 01101 1 |  | 011010 | 100101 | NDRS6 | - | XB6 | 0 |
| D/K23 | 11101 x |  | 111010 | 000101 | NDRS6 | - |  | + |
| D/K24 | 00011 x |  | 000110 | 111001 | PDRS6 | + |  | - |
| K25 | 10011 1 |  | 100110 | 011001 | NDRS6 | - | YB6 | 0 |
| K26 | 01011 1 |  | 010110 | 101001 | NDRS6 | - | YB6 | 0 |
| D/K27 | 11011 x |  | 110110 | 001001 | NDRS6 | - |  | + |
| D/K29 | 10111 x |  | 101110 | 010001 | NDRS6 | - |  | + |
| D/K30 | 01111 x |  | 011110 | 100001 | NDRS6 | - |  | + |

FIG. 24

| NAME | ABCDE K | INVERTED BITS | PRIMARY abcdei | ALTERNATE abcdei | DR CLASS | DR | DB CLASS | DB |
|------|---------|---------------|----------------|------------------|----------|----|---------|----|
| K2 | 01000 1 | EI | 010011 | 101100 | NDRS6 | - | A'·C'·E'·K | 0 |
| K3 | 11000 1 | | 110000 | 001111 | PDRS6 | + | | - |
| D/K5 | 10100 x | | 101000 | 010111 | PDRS6 | + | | - |
| D/K6 | 01100 x | | 011000 | 100111 | PDRS6 | + | | - |
| D/K7 | 11100 x | | 111000 | 000111 | NDRS6 | - | ZB6 | 0 |
| D/K9 | 10010 x | | 100100 | 011011 | PDRS6 | + | | - |
| D/K12 | 00110 x | | 001100 | 110011 | PDRS6 | + | | - |
| D/K17 | 10001 x | | 100010 | 011101 | PDRS6 | + | | - |
| D/K18 | 01001 x | | 010010 | 101101 | PDRS6 | + | | - |
| D/K20 | 00101 x | | 001010 | 110101 | PDRS6 | + | | - |
| D/K23 | 11101 x | | 111010 | 000101 | NDRS6 | - | | + |
| D/K24 | 00011 x | | 000110 | 111001 | PDRS6 | + | | - |
| D/K27 | 11011 x | | 110110 | 001001 | NDRS6 | - | | + |
| D/K29 | 10111 x | | 101110 | 010001 | NDRS6 | - | | + |
| D/K30 | 01111 x | | 011110 | 100001 | NDRS6 | - | | + |

# 5B/6B-T, 3B/4B-T AND PARTITIONED 8B/10B-T AND 10B/12B TRANSMISSION CODES, AND THEIR IMPLEMENTATION FOR HIGH OPERATING RATES

FIELD OF THE INVENTION

The present invention relates to transmission codes and, more particularly, relates to methods and apparatuses used to produce and interpret 5B/6B, 3B/4B, 8B/10B, and 10B/12B transmission codes.

BACKGROUND OF THE INVENTION

In a partitioned 8B/10B transmission code, an input vector having eight bits is partitioned into two smaller vectors having three and five bits, respectively. Coded vectors having four and six bits, respectively, are created from the partitioned vectors through use of 3B/4B and 5B/6B transmission code vector sets. The resultant coded vectors then form a single ten-bit coded vector suitable for transmission. Generally, a control input generates control characters readily recognized as other than the 256 data characters in an 8B/10B transmission code.

The original partitioned 8B/00B transmission code, introduced more than 20 years ago, was designed to minimize the number of gates required for encoding and decoding. The original partitioned 8B/10B transmission code is described in Franaszek and Widmer, U.S. Pat. No. 4,486,739, issued Dec. 4, 1984, the disclosure of which is hereby incorporated by reference. The original circuitry was implemented with emitter coupled logic, some versions were also done in bipolar transistor/transistor logic, and this was followed by several complementary metal oxide silicon designs. One example is PCT No. US02/13798, entitled "8B/10B Encoding and Decoding for High Speed Applications," claiming the benefit of U.S. Patent Application No. 60/289,556 that was filed on May 8, 2001, the disclosure of which is hereby incorporated by reference.

Lately, design efforts have concentrated on high operating rates. Traditional means for achieving higher operating rates for transmission codes, such as the partitioned 8B/10B transmission code, have involved the parallel operation of several encoders and decoders. Current important potential applications for the partitioned 8B/10B transmission code and its 5B/6B component are for very wide high speed buses using sets of parallel serial links, with each serial link operating up to dozens of Gbaud for short links which require short latencies for performance reasons. Operation with a single CoDec (coder/decoder) circuit for each serial link, or a reduction of the multiplexing ratios required at both ends to accommodate parallel CoDec circuits required to serve a single link, is desirable to improve the latency aspect.

Although conventional 8B/10B encoding and decoding work well for a large number of applications, the conventional codes could be improved, particularly in operating rates and latency. Thus, what is needed is a partitioned 8B/10B transmission code and apparatus using the same that allow high operating rates and low latency.

Additionally, some applications are compatible with 5-bit data units. It would be beneficial to enable the use of 5B/6B transmission codes with such applications in the form, for instance, of 10B/12B transmission codes. Consequently, improvements to 10B/12B transmission codes are desired.

SUMMARY OF THE INVENTION

The present invention provides techniques for implementing 5B/6B, 3B/4B and partitioned 8B/10B and 10B/12B transmission codes for high operating rates.

In an exemplary aspect of the invention, techniques are disclosed for translating five-bit source vectors, each having five source bits, from a number of five-bit source vectors into six-bit coded vectors. A sixth bit having a default value is appended to the source vectors. Selected one to three individual source bits are complemented for a minority of the source vectors. The coded vectors are disparity independent with a single representation or disparity dependent with a primary and an alternate representation, where the alternate representation is a complement of the primary representation.

In another exemplary aspect of the invention, techniques are disclosed for translating three-bit source vectors, together with one or more control inputs, into nine four-bit coded vectors. The source vectors have three source bits. A fourth bit having a default value is appended to the source vectors. A single individual source bit is complemented for a minority of the source vectors. The coded vectors are disparity independent with a single representation or disparity dependent with a primary and an alternate representation, where the alternate representation is a complement of the primary representation.

In another exemplary aspect of the invention, techniques are presented for encoding a partitioned 10B/12B transmission code. Pairs of five-bit source vectors are operated on to produce pairs of six-bit coded vectors. A starting disparity is determined. A synchronizing coded pattern is generated based on the starting disparity. When the starting disparity is positive, a predetermined pattern is generated. When the starting disparity is negative, a complement of the predetermined pattern is generated.

A more complete understanding of the present invention, as well as further features and advantages of the present invention, will be obtained by reference to the following detailed description and drawings.

BRIEF DESCRIPTION OF THE DRAWINGS

FIG. 5 is a coding table for the 5B/6B-T code portion of an 8B/10B-T transmission code according to an embodiment of the invention;

FIG. 6 is a coding table for the 3B/4B-T code portion of an 8B/10B-T transmission code according to an embodiment of the invention;

FIG. 7 is a coding table for a basic set of control characters for an 8B/10B-T transmission code according to an embodiment of the invention;

FIG. 8 is a coding table for an additional set of control characters for an 8B/10B-T transmission code according to an embodiment of the invention;

FIG. 12A illustrates the interrelationship between FIGS. 12 and 12 cont.;

FIG. 13A illustrates the interrelationship between FIGS. 13 and 13 cont.;

FIG. 16 is a decoding table for decoding the 4B/3B-T code portion of a 10B/8B-T transmission code according to an embodiment of the invention;

FIG. 23 is a table showing 5B/6B-T encoding for 10B/12B-T control characters;

FIG. 24 is a table of 6B trailers of the K3 vector used to form 12B control characters;

DETAILED DESCRIPTION OF PREFERRED EMBODIMENTS

Figure 1A:
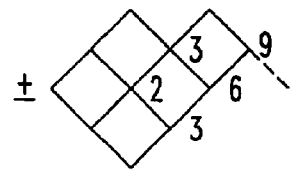
FIG. 1A is a trellis diagram illustrating a number of primary vectors of a 5B/6B-T code portion of an 8B/10B-T transmission code according to an embodiment of the invention.

The present invention provides techniques for speeding up encoding and decoding for 8B/10B and 10B/12B transmission codes.

A. Introduction

The appendage "-T" (i.e., "Turbo") is added to the references to the transmission codes used herein in order to distinguish these codes from conventional codes. The new 8B/10B-T transmission code retains the 5B/6B-T and the 3B/4B-T partitions. The codes presented herein are designed for high speed operation. Many of the changes between the conventional transmission codes and the transmission codes described herein are in the 5B/6B-T domain. For instance, for both the 5B/6B-T encoding and decoding described herein, fewer modifications of bit positions, in fewer vectors, are performed as compared to conventional 5B/6B techniques. As another example, the S-Function, which has an important purpose of preventing false commas, has been reduced to the minimum required to maintain the singularity of the comma at the expense of more frequent single runs of five in random data. A comma generally indicates proper byte boundaries and can be used for instantaneous acquisition or verification of byte synchronization. The K28.7 comma character of the traditional code has been swapped with a formerly invalid control character K3.7 ('1100001110' and its complement) which is not a comma character but has no sequence restrictions. Seven additional control characters have been defined and are listed in the table shown in FIG. 8.

Notation

The signal names used in the equations of this document do not reflect any logic levels. Instead, they should be interpreted as abstract logic statements. However, in the circuit diagrams, the signal names may be prefixed with the letter P or N to indicate whether the function is true at the upper or lower level, respectively. The P and N prefixes are normally not used for net names which start with P and N, respectively. Net numbers starting with 'n' or 'm' are true at the lower level and take the P prefix if true at the upper level. In the logic equations, the symbols −, +, and ⊕ represent the Boolean AND, OR, and EXCLUSIVE OR functions, respectively. The apostrophe (') represents negation.

B. 5B/6B-T Encoding

In an exemplary embodiment, the 33 primary 6B vectors are classified into five groups as illustrated by the trellis diagrams of FIGS. 1A, 1B, 2, 3, and 4. All the coded vectors of FIGS. 2 through 4 have alternate, complementary versions (not shown in these figures but shown in FIG. 5) assigned to an identical source vector.

Conceptually, coding is generally performed in two steps. First, the translation to a primary vector is made. For the coded vectors of FIGS. 1A, 2, 3, and 4, the first five bits of the coded vector are identical to the source vector and the sixth and last bit assumes a default value of zero. Any vectors with changes in individual bits of the source vector belong to the balanced, disparity independent class of FIG. 1B. A second step for the subset of the disparity dependent 120 coded vectors of FIGS. 2, 3, and 4 determines whether the alternate, complemented vector must be used to meet the disparity rules. Disparity dependent vectors have a plus sign or a minus sign in the DR column of the tables.

Generation of Primary 6B-T Vectors

The logic equations necessary for the translation to the primary vectors can be read directly from the columns 'Primary abcdei' and 'Primary fghj' of the tables shown in FIGS. 5 and 6, respectively. FIG. 5 shows a table for 5B16B-T encoding, while FIG. 6 shows a table for 3B/4B-T encoding. In the 'Primary' columns of these tables, all plain bits are the same as the corresponding input bit values ABCDE or FGH, respectively. The bold and underlined bits are forced to the complemented value indicated. The i-bit and the j-bit have a default value of zero. For the new code, only the nine 6B-T vectors of FIG. 1B require any changes in individual bit values as indicated by underscored bold entries and explicitly stated in the column 'Inverted Bits'.

The encoding equations are extracted from the encoding tables in methodical steps as described below. For each column of a coded bit such as 'a', the vectors which require changes are listed, the bits to be complemented have a superscript asterisk, and the bits which can be used to classify the source vector sets are generally presented in boldface type.

The 'a' column has bold entries for D0, D15, D16, and D31. The respective uncoded bits ABCDE are listed, the A-bit has a superscript asterisk, and common patterns are marked to logically classify the vectors by simple expressions.

| D0  | 0* 0 0 0 0 | D15 | 1* 1 1 1 0 |
| D16 | 0* 0 0 0 0 | D31 | 1* 1 1 1 1 |

Ignoring the 'A' bit, D0 and D16 can be identified as a class by $B' \cdot C' \cdot D'$.

D15 and D31 are identified by BCD.

Using these identifiers, the encoding equation for bit 'a' can be written as follows:

$$a = A \cdot (B \cdot C \cdot D)' + B' \cdot C' \cdot D'$$

The 'b' column has bold entries for D4, D8, D15, and D31.

| D4 | 0 0* 1 0 0 | D15 | 1 1* 1 1 0 |
| D8 | 0 0* 0 1 0 | D31 | 1 1* 1 1 1 |

Ignoring the 'B' bit, D4 and D8 can be identified as a class by $A' \cdot E' \cdot (C \neq D)$.

D15 and D31 are identified by ACD.

Using these identifiers, the encoding equation for bit 'b' can be written as follows:

$$b = B \cdot (A \cdot C \cdot D)' + A' \cdot E' \cdot (C \neq D).$$

The 'c' column has a bold entry for D1.

D1 1 0 0* 0 0

The encoding equation for bit 'c' can be written as follows;

$$c = C + A \cdot B' \cdot D' \cdot E'$$

The 'd' column has bold entries for D0 and D31.

D0 0 0 0 0* 0
D31 1 1 1 1* 1

The encoding equation for bit 'd' can be written as follows:

$$d = D \cdot (A \cdot B \cdot C \cdot E)' + (A' \cdot B' \cdot C' \cdot E')$$

The 'e' column has a bold entry for D2.

D2 0 1 0 0 0*

The encoding equation for bit 'e' can be written as follows:

$$e = E + A' \cdot B \cdot C' \cdot D'$$

The 'i' column has nine entries with a value of one. All are marked in bold because the default value for the i-bit is zero.

| D0 | 0 0 0 0 0 | D0  | 0 0 0 0 0 | D4  | 0 0 1 0 0 |
| D1 | 1 0 0 0 0 |     |           | D16 | 0 0 0 0 1 | D8  | 0 0 0 1 0 |
| D2 | 0 1 0 0 0 |     |           |     |           | D15 | 1 1 1 1 0 |
| D3 | 1 1 0 0 0 | K = 0 |         |     |           | D31 | 1 1 1 1 1 |

The first four entries D0 to D3 can be identified by $C' \cdot D' \cdot E' \cdot K'$.

D0 and D16 are identified by $A' \cdot B' \cdot C' \cdot D'$ (taking advantage of redundancy, since D0 is also listed in the left column).

D4 and D8 are identified by $A' \cdot B' \cdot E' \cdot (C \neq D)$.

D15 and D31 are identified by $A \cdot B \cdot C \cdot D$.

The encoding equation for bit 'i' can be written as follows:

$$i = C' \cdot D' \cdot E' \cdot K' + A' \cdot B' \cdot C' \cdot D' + A' \cdot B' \cdot E' \cdot (C \neq D) + A \cdot B \cdot C \cdot D$$

An important purpose for the S-function (e.g., S1 and S2 annotation in FIG. 5) is to prevent false commas in the bits 'cdeifgh'. In the original 8B/10B code of Franaszek and Widmer, U.S. Pat. No. 4,486,739, incorporated by reference above, the vectors D11 and D31 (D20 in the original code) were included in the S-function only to lower the incidence of runs of five. They are left out now in order to reduce logic delay in the path for the encoding of the f and j bits, which have now delays comparable with the other bits. This simplifies and increases the effectiveness of pipe-lining, which is preferred for some high speed applications over parallel operation of several encoders for a single serial lane. The incidence of runs of five is now an average of about once per 256 bytes of random data, but there are still no contiguous runs of five.

For a positive running disparity at the front of the 6B vector (PDFS6), the S function should be asserted for the two balanced vectors for which the coded pattern ends with cdei=1100.

| | Source Vector | Coded Vector |
| --- | --- | --- |
| D13 | 1 0 1 1 0 | 1 0 1 1 0 0 |
| D14 | 0 1 1 1 0 | 0 1 1 1 0 0 |
| S1 = PDFS6 · C · D · E' · (A ≠ D) | | |

For a negative running disparity at the front of the 6B vector (NDFS6), the S function should be asserted for the two balanced vectors for which the coded pattern ends with cdei=0011.

| | Source Vector | Coded Vector |
| --- | --- | --- |
| D2 | 0 1 0 0 0 | 0 1 0 0 1 1 |
| D16 | 0 0 0 0 1 | 1 0 0 0 1 1 |
| S2 = NDFS6 · A' · C' · D' · (8 ≠ E) | | |

C. 3B/4B-T Encoding

New 3B/4B-T vector assignments have been made following similar guidelines as used for the 5B/6B-T part. Changes are also made to accommodate the control character swap referred to above. FIG. 6 shows a coding table for the 3B/4B-T transmission code. The 3B/4B-T encoding equations can be directly derived from FIG. 6.

For the 'f' column, the coding equation is as follows:

$$f=F \cdot [F \cdot G \cdot H \cdot (S+Ky)]'=F \cdot [G \cdot H \cdot (S+Ky)]',$$

where S=S1+S2 and Ky=K23+K27+K29+K30=K·K3'=K·E.
Source Vector
K23 1 1 1 0 1 1
K27 1 1 0 1 1 1
K29 1 0 1 1 1 1
K30 0 1 1 1 1 1
K3 1 1 0 0 0 1

Ky includes also the control characters of FIG. 8, if implemented, and the simple equation Ky=KE still holds for six of those characters (K19.7, K21.7, K22.7, K25.7, K26.7, K28.7).

Because the primary interest here is minimum circuit delay rather than circuit area, the equation for bit 'f' is transformed as follows to reduce the logic depth:

$$f=F'+G \cdot H \cdot S1+G \cdot H \cdot S2+G \cdot H \cdot K \cdot E$$

$$f=F'+G \cdot H \cdot C \cdot D \cdot E' \cdot (A \neq B) \cdot PDFS6+G \cdot H \neq A' \cdot C' \cdot D' \cdot (B \neq E) \cdot NDFS6+ G \cdot H \cdot K \cdot E$$

For the actual circuit implementation, the term G·H is expanded back to F·G·H because the full term is required for the j-bit encoding anyway.

For the 'g' column, the coding equation is as follows:

$$g=G+F' \cdot G' \cdot H'=G+F' \cdot H'$$

For the 'h' column, the coding equation is as follows:

$$h=H$$

For the 'j' column, the coding equation is as follows:

$$j=G' \cdot H'+F \cdot G \cdot H \cdot (S+Ky)$$

$$j=G'+H'+F \cdot G \cdot H \cdot S1+F \cdot G \cdot H \cdot S2+F \cdot G \cdot H \cdot Ky$$

$$j=G' \cdot H'+F \cdot G \cdot H \cdot C \cdot D \cdot E' \cdot (A \neq B) \cdot PDFS6+ F \cdot G \cdot H \cdot A' \cdot C' \cdot D' \cdot (B \neq E) NDFS6+F \cdot G \cdot H \cdot K \cdot E$$

D. Control Characters

A basic set of 12 control characters is listed in the table shown in FIG. 7. The coded format of all characters except K3.7 is identical to the traditional partitioned 8B/10B code. However, the source vector K28 is replaced by its complement K3 and so the name for the respective identical coded vectors is changed. K3.1 and K3.5 are comma characters and the comma sequence is printed in bold type. Note that because of the run length limit of five, the second bit (b) of the sequence can be left out for purposes of comma search circuits which limits the search to 1x00000 or 0x11111.

In the table of FIG. 7, the column heading 'Primary (6B)' refers to the fact that the 6B part of the 10-bit control vectors of that column are primary vectors. The 4B part may be the alternate vector. This distinction has no significance beyond semantics.

An additional set of seven control characters are defined in the table shown in FIG. 8. All these characters use the alternate A7 coding in the 4B domain when following a 6B vector with K=1, which does not require the alternate code for purposes of compliance with the coding constraints. The 6B part is a disparity dependent balanced vector, which is complemented by analogous rules as are the balanced 4B vectors when the K-bit has a value of one. These seven extra characters are not implemented in the circuit diagrams attached and treated as invalid characters. It is useful to know of their existence for certain applications.

E. Implementation of 8B/10B-T Bit Encoding

Figure 9A:
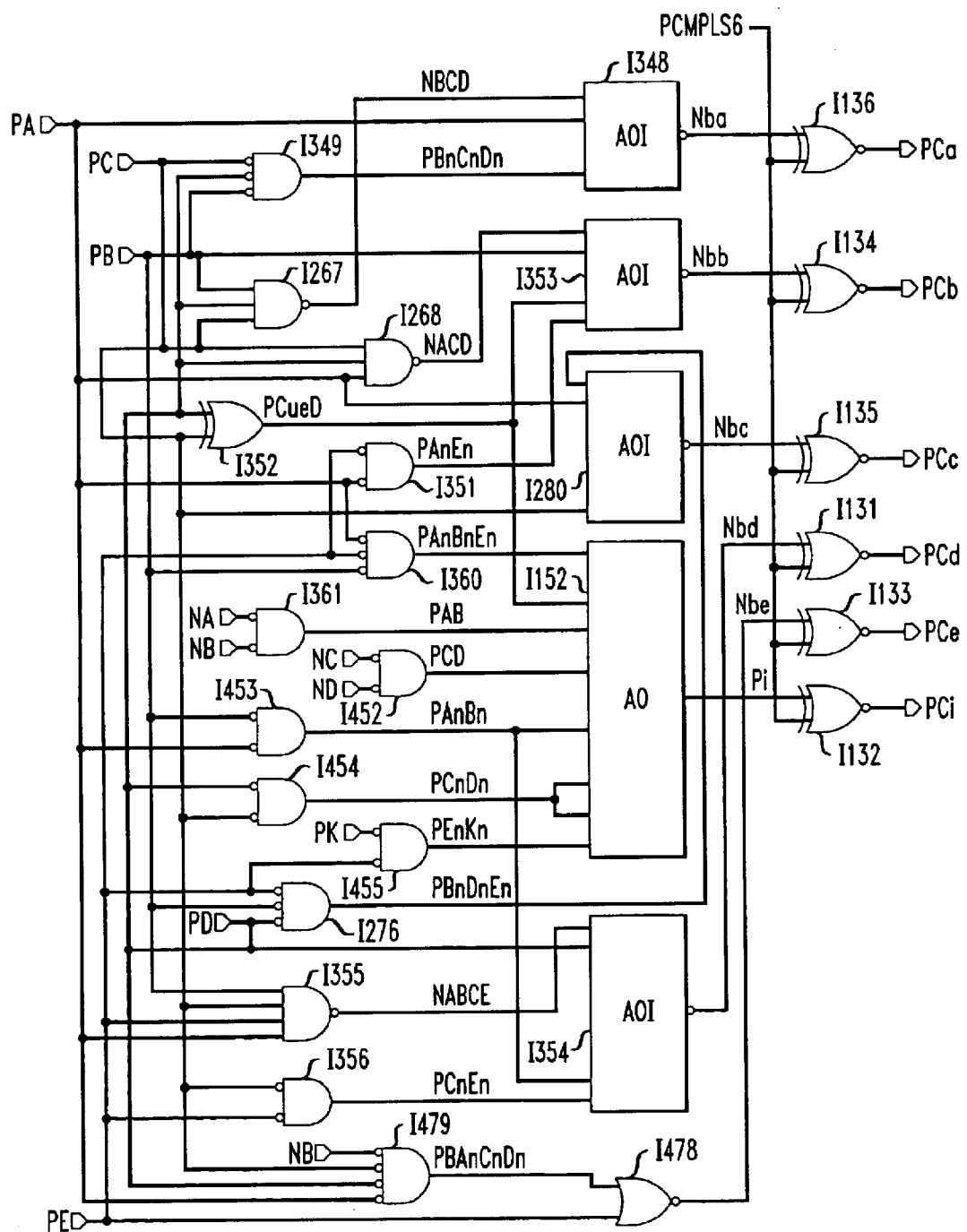
FIG. 9A is a circuit diagram of the bit encoding portion of an 8B/10B-T encoder according to an embodiment of the invention.
Figure 9A:
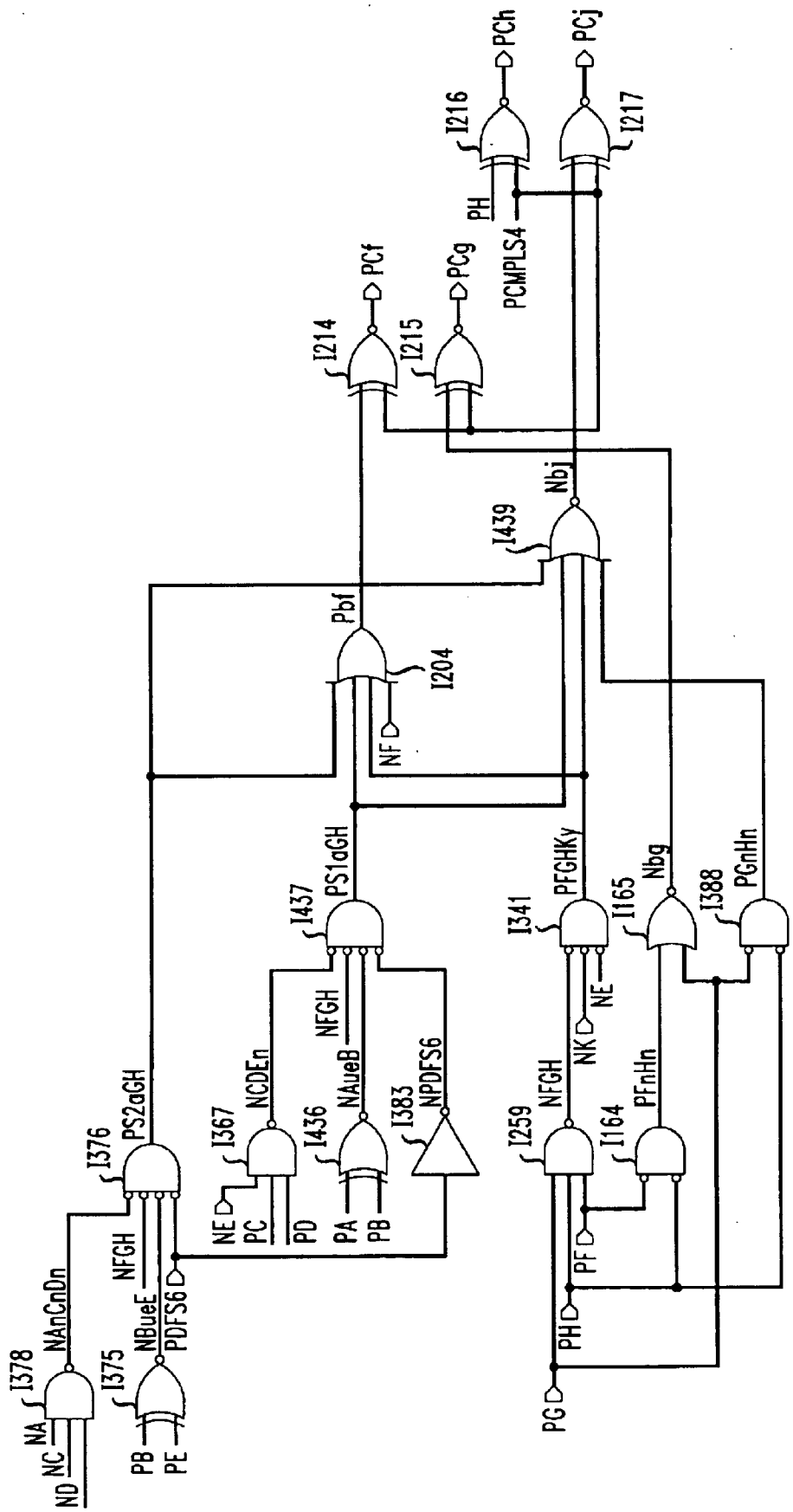

An implementation according to the above table shown in FIGS. 5 and 6, equations and design principles is illustrated in the circuit diagram shown in FIG. 9A. FIG. 9A shows an encoding portion of 8B/10B-T encoding circuitry. The design presented here assumes that all inputs are available in complementary form. PA, PB, PC, PD, and PE are from a five-bit source vector, from which the six-bit coded vector PCa, PCb, PCd, PCe, and PCi is created. PF, PH, and PG are from a three-bit source vector, from which four-bit coded vector PCf, PCg, PCh, and PCj is created.

Figure 9B:
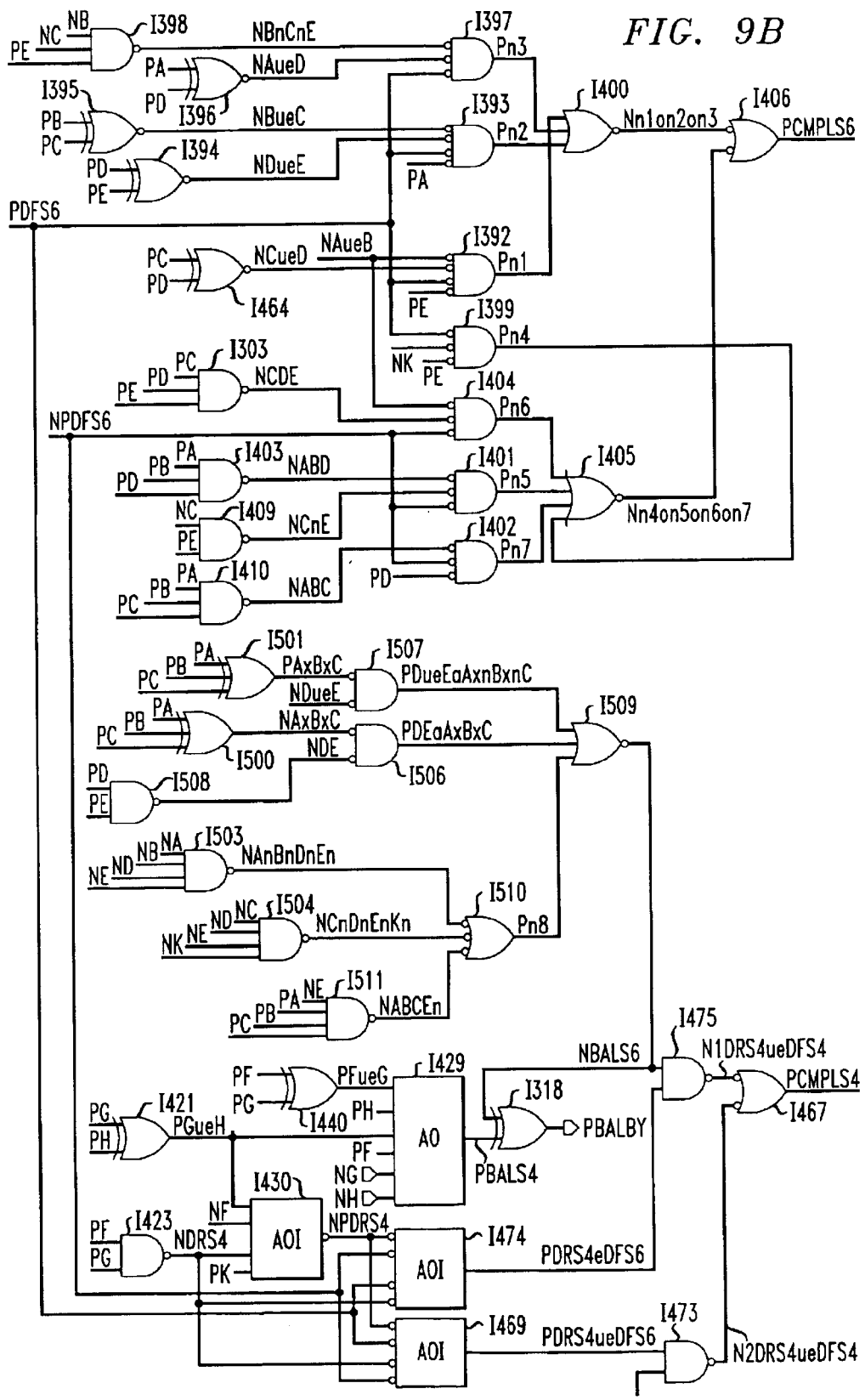
FIG. 9B is a circuit diagram of the disparity control portion of an 8B/10B-T encoder according to an embodiment of the invention.
Figures 9B, 9C:
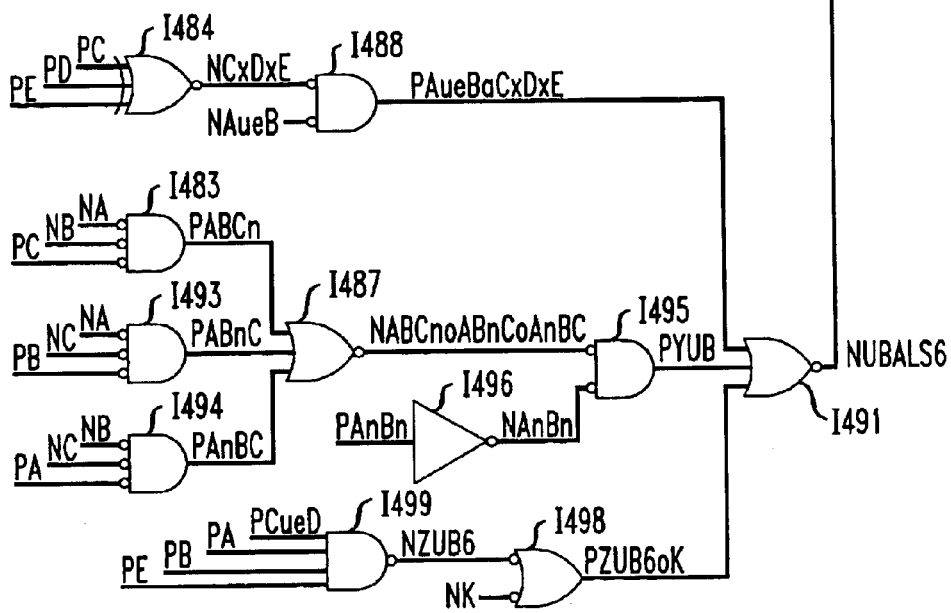
FIG. 9C illustrates the interrelationship between FIGS. 9B and 9B cont.

In FIGS. 9A and 9B, there are a number of AND-OR (AO) blocks I152 and I429. There are also a number of AND-OR-INVERT (AOI) blocks I353, I348, I280, I354, I430, I474, and I469. An AO block contains a number of two-input AND gates, the outputs of which are coupled to an OR gate. An AOI block is similar, but the output of the OR gate is inverted. AO and AOI blocks are described in more detail in Widmer, PCT Application No. US02/13,798, entitled, "8B/10B Encoding and Decoding for High Speed Applications," filed on Apr. 30, 2002 (claiming the benefit of U.S. Provisional Patent Application No. 60/289,556, filed on May 8, 2001), already incorporated by reference above.

The signal PCMPLS6 comes from the disparity control circuit shown in FIG. 9B. This signal is used to invert the primary coded vector abcdei to create the alternate coded vector (abcdei)'. This inversion is performed according to disparity rules. Similarly, the signal PCMPLS4 comes from the disparity control circuit shown in FIG. 9B below, and this signal is used to invert the primary coded vector fghj to create the alternate coded vector (fghj)' according to disparity rules.

Notation for net names in the encoding circuit diagrams: The letters 'a' and 'o' within net-names refer to the Boolean AND and OR functions, respectively. The letter 'n' within a name negates the preceding parameter. The letters 'e' and 'ue' represent the symbols '=' and '≠', respectively. The capital letters "ABCDEFGHK" represent the uncoded input bits and the lower case letters "abcdeifghj" represent the coded format. These notations have been adopted because of the limitations of the logic design system.

F. 8B/10B-T Disparity Control

FIG. 9B shows a disparity control portion of the 8B/10B-T encoding circuitry. The circuit in FIG. 9B is used for computing disparity, in accordance with disparity rules. The column 'DR Class' (DR=required running disparity) in FIGS. 5 and 6 classifies the vectors according to the plus sign and the minus sign entries, which indicate the required disparity at the front of the primary coded vector. The expressions PDRS6, PDRS4 and NDRS6, NDRS4 represent a positive or negative required disparity, respectively, at the start of the 6B or 4B vectors. These signal names do not appear in the circuit diagram, because the gating required for CMPLS6 and CMPLS4 described below has been merged with said functions in order to eliminate one gating level.

1. PDRS6

The set of ten primary 6B vectors with a negative block disparity and a plus sign in the DR column of FIG. 5 is referred to as PDRS6. All are illustrated in the trellis diagram of FIG. 4. They are generated by appending a zero bit to the following source vectors:

| | | | | | |
|---|---|---|---|---|---|
| D5  | 1 0 1 0 0 | D12 | 0 0 1 1 0 | D17 | 1 0 0 0 1 |
| D6  | 0 1 1 0 0 | D18 | 0 1 0 0 1 | D24 | 0 0 0 1 1 |
| D9  | 1 0 0 1 0 | D20 | 0 0 1 0 1 | K3  | 1 1 0 0 0   K = 1 |
| D10 | 0 1 0 1 0 | D10 | 0 1 0 1 0 | | |

The vectors D5, D6, D9, and D10 can be identified by the expression $E' \cdot (A \neq B) \cdot (C \neq D)$.

The vectors D12, D18, D20, and D10 (redundant) are identified by $A' \cdot (B \neq C) \cdot (D \neq E)$.

The vectors D17 and D24 are identified by $B' \cdot C' \cdot E \cdot (A \neq D)$.

The control vector K3 can be identified by $E' \cdot K$ since an examination of FIG. 5 shows that the other control characters K23, K27, K29, and K30 have all a value of one in bit position E.

The equation for PDRS6 cap thus be expressed as follows:

$$PDRS6 = E' \cdot (A \neq B) \cdot (C \neq D) + A' \cdot (B \neq C) \cdot (D \neq E) + B' \cdot C' \cdot E \cdot (A \neq D) + E' \neq K$$

2. NDRS6

The set of five 6B vectors with a minus sign in the DR column of FIG. 5 is referred to as NDRS6. Four of these vectors have a positive block disparity and are illustrated in the trellis diagram of FIG. 3. The balanced vector D7 (111000) of FIG. 2 also requires a negative entry disparity.

| | | | | | |
|---|---|---|---|---|---|
| D7    | 1 1 1 0 0 | D/K29 | 1 0 1 1 1 | D/K27 | 1 1 0 1 1 |
| D/K23 | 1 1 1 0 1 | D/K30 | 0 1 1 1   | | |

The vectors D7 and D/K23 can be identified by $A \cdot B \cdot C \cdot D \cdot$.

The vectors D/K29 and D/K30 are identified by $C \cdot D \cdot E \cdot (A \neq B)$.

The vector D/K27 is identified by $A \cdot B \cdot C' \cdot D \cdot E$.

So the equation for NDRS6 is as follows:

$$MDRS6 = A \cdot B \cdot C \cdot D' + C \cdot D \cdot E \cdot (A \neq B) + A \cdot B \cdot C' \cdot D \cdot E$$

3. PDRS4

The table of FIG. 6 shows a plus sign in the DR column for the following six vectors shown with their uncoded values FGH K:

| | | | | |
|---|---|---|---|---|
| K3.0 | 0 0 0 1 | Dx/K3.2 | 0 1 0 x | |
| K3.1 | 1 0 0 1 | Dx/K3.4 | 0 0 1 x | |
| K3.5 | 1 0 1 1 | | | |
| K3.6 | 0 1 1 1 | | | |

The four vectors in the left column above can be identified by $K \cdot (F \cdot G)'$ since none of the control characters have a DR entry of $\pm$ and all control characters with a negative DR have bit values of one for both the F and the G bit as shown in FIG. 6.

The two vectors of the right column are identified by $F' \cdot (G \neq H)$.

The equation for PDRS4 is as follows:

$$PDRS4 = K \cdot (F \cdot G)' + F' \cdot (G \neq H)$$

4. NDRS4

There are four rows in FIG. 6 with a minus entry in the DR column. They all can be uniquely identified by FG. Therefore:

$$NDRS4 = F \cdot G$$

5. CMPLS6 and CMPLS4

If the running disparity DF in front of the vector does not match the required entry disparity DR, a complement signal is generated which selects the alternate vector.

$$CMPLS6 = NDFS6 \cdot PDRS6 + PDFS6 \cdot NDRS6$$
$$CMPLS4 = NDFS4 \cdot PDRS4 + PDFS4 \cdot NDRS4$$

In the circuit diagrams, the signal names PDFS6, PDFS4 and NDFS6 and NDFS4 represent the actual running disparity at the front of the 6B and 4B vectors, respectively. Note that in the above two equations, the signals NDFS and PDFS are complementary and the signals PDR and NDR are orthogonal, i.e. only one can be true, but both can be false.

6. BALS6

Figure 1B:
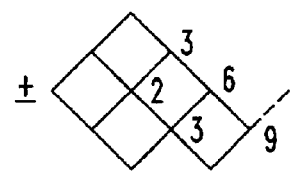
FIG. 1B is a trellis diagram illustrating a number of primary vectors of a 5B/6B-T code portion of an 8B/10B-T transmission code according to an embodiment of the invention.
Figure 2:
FIG. 2 is a trellis diagram illustrating a primary vector of a 5B/6B-T code portion of an 8B/10B-T transmission code according to an embodiment of the invention.

The set of 19 primary 6B vectors of FIGS. 1A, 1B and 2 are balanced and identified by a 0 in the column 'DB Class' (i.e., block disparity). This set of vectors is referred to as BALS6 and can be grouped as shown below:

| | | | |
|---|---|---|---|
| D0 0 0 0 0 0 0        | D8  0 0 0 1 0     | D25 1 0 0 1 1 | D0 0 0 0 0 0 |
| D1 1 0 0 0 0 0        | D11 1 1 0 1 0     | D26 0 1 0 1 1 | D4 0 0 1 0 0 |
| D2 0 1 0 0 0 0        | D13 1 0 1 1 0     | D28 0 0 1 1 1 |              |
| D3 1 1 0 0 0  K = 0   | D14 0 1 1 1 0     | D31 1 1 1 1 1 | D7 1 1 1 0 0 |
|                       | D16 0 0 0 0 1     |               | D15 1 1 1 1 0 |
|                       | D19 1 1 0 0 1     |               |              |
|                       | D21 1 0 1 0 1     |               |              |
|                       | D22 0 1 1 0 1     |               |              |

The 4 vectors D0, D1, D2, and D3 are identified by $C' \cdot D' \cdot E' \cdot K'$.

The 8 vectors D8, D11, D13, D14, D16, D19, D21, and D22 are identified by $$XB6 = (D \neq E) \cdot (A' \cdot B' \cdot C' + A \cdot B \cdot C' + A \cdot B' \cdot C + A' \cdot B \cdot C) = (D \neq E) \cdot (A \oplus B \oplus C)'.$$

The 4 vectors D25, D26, D28, and D31 are identified by $$YB6 = D \cdot E \cdot (A \cdot B \cdot C + A \cdot B' \cdot C' + A' \cdot B \cdot C' + A' \cdot B' \cdot C) = D \cdot E \cdot (A \oplus B \oplus C).$$

The 2 vectors D0 (redundant from Column 1) and D4 are identified by $$WB6 = A \propto \cdot B' \cdot D' \cdot E'.$$

The 2 vectors D7 and D15 are identified by $ZB6 = A \cdot B \cdot C \cdot E'$.

So the equation for BALS6 can be expressed as:

$$BALS6 = (D \neq E) \cdot (A \oplus B \oplus C)' + D \cdot E \cdot (A \oplus B \oplus C) + A' \cdot B' \cdot D' \cdot E' + C' \cdot D' \cdot E' \cdot K' + A \cdot B \cdot C \cdot E'$$

In the usual circuit implementations, the signal BALS6 is in the critical delay path and required in true and complement form which requires an inversion with extra delay. This problem can be side-stepped by generating the UNBALS6 signal directly from the inputs similar to the circuit for BALS6. The UNBALS6 signal requires only nine gates and is slightly less complex and has a little less delay, so if only one of the signals is generated and then inverted, preference should be given to the UNBALAS6 signal. It is derived from the following grouping of all the vectors which have an entry other than 0 in the column DB of FIG. 5.

The 8 vectors D5, D9, D17, D29, D6, D10, D18, and D30 in the left column of the list below are identified by $$XUB6 = (A \neq B) \cdot (C \cdot D' \cdot E' + C' \cdot D \cdot E' + C' \cdot D' \cdot E + C \cdot D \cdot E) = (A \neq B) \cdot (C \oplus D \oplus E).$$

The three vectors D12, D20, and D24 in the second column can be identified by $$YUB6 = A' \cdot B' \cdot (A \cdot B \cdot C' + A \cdot B' \cdot C + A' \cdot B \cdot C).$$

The two vectors D23 and D27 in the third column can be identified by $$ZUB6 = A \cdot B \cdot E \cdot (C \neq D).$$

The single vector K3 in the right column can be uniquely identified by K=1 since coded 6B K vectors are unbalanced.

| | | | | | | | | |
|---|---|---|---|---|---|---|---|---|
| D5 | 1 0 1 0 0 | D12 | 0 0 1 1 0 | D/K23 | 1 1 1 0 1 | K3 | 1 1 0 0 0 0 | K = 1 |
| D9 | 1 0 0 1 0 | D20 | 0 0 1 0 1 | D/K27 | 1 1 0 1 1 | | | |
| D17 | 1 0 0 0 1 | D24 | 0 0 0 1 1 | | | | | |
| D/K29 | 1 0 1 1 1 | | | | | | | |
| D6 | 0 1 1 0 0 | | | | | | | |
| D10 | 0 1 0 1 0 | | | | | | | |
| D18 | 0 1 0 0 1 | | | | | | | |
| D/K30 | 0 1 1 1 1 | | | | | | | |

So the equation for UNBALS6 can be expressed as:

$$UNBALS6 = (A \neq B) \cdot (C \oplus D \oplus E) + A' \cdot B' \cdot (A \cdot B \cdot C' + A \cdot B' \cdot C + A' \cdot B \cdot C) + A \cdot B \cdot E \cdot (C \neq D) + K$$

7. BALS4

The set of ten source vectors with a zero in the DB column of FIG. 6 is referred to as BALS4.

| | | | | | | |
|---|---|---|---|---|---|---|
| Dx/K3.0 | 0 0 0 | Dx/K3.3 | 1 1 0 | Dx/K3.6 | 0 1 1 |
| Dx/K3.1 | 1 0 0 | Dx/K3.5 | 1 0 1 | Dx/K3.5 | 1 0 1 |

In the third column, the Dx/K3.5 vector pair is listed redundantly to simplify the logic expression below.

$$BALS4 = G' \cdot H' + F \cdot (G \neq H) + H \cdot (F \neq G)$$

Additional circuits governed by the signals BALS6 and BALS4 indicate the balance of a byte by the signal PBALBY which assumes the upper level for a balanced byte.

The technique for reducing the delay for the disparity function extending over one or more bytes as taught in Widmer, PCT No. US02/13798, entitled "8B/10B Encoding and Decoding for High Speed Applications," claiming the benefit of U.S. Patent Application No. 60/289,556 that was filed on May 8, 2001, the disclosure of which is already incorporated by reference above, apply equally to the code presented here and is summarized briefly again. See FIGS. 3B, 5, 6, 7, and 8 in Widmer, PCT No. US02/13798. A reduction in the combined delay of a 5B/6B (or 5B/6B-T) and a 3B/4B (or 3B/4B-T) encoder or of several 8B/10B (or 8B/10B-T) encoders operating in parallel results from the methodology used to determine the disparity at any vector boundary as shown at the bottom of circuit diagram FIG. 9B and on the diagram FIG. 10 (described below). Given a starting disparity such as NDFBY (Negative Disparity in Front of a Byte), the running disparity at any subsequent vector boundary remains unchanged if the combined number of balanced S6 and S4 vectors between the two points is even, otherwise it assumes the complementary polarity. This is in contrast to the more obvious techniques which observe the disparity as it propagates from vector to vector. The expression NDFS4 represents a negative running disparity in front of the 4B vector.

The 8B/10B-T encoding circuitry of FIG. 9B has an output which indicates whether the coded 10-bit byte is balanced or not, but there is no output to indicate the ending disparity. Generally, the starting disparity for a vector is determined from the disparity of a prior reference point and the odd or even number of balanced vectors in between.

G. Staggered 5B/6B-T and 3B/4B-T Encoding and Decoding

Staggered timing of the 5B/6B-T and 3B/4B-T encoding and decoding circuits can be used to reduce the latency of transceivers which can be an issue for short connections. It also helps to reduce the performance requirements of the circuits.

Before consideration is given to pipe-lining either the 5B/6B-T or the 3B/4B-T encoder, the possibility of delaying the encoding of the 4B vectors with reference of the 6B vectors should be evaluated. The encoder output is typically fed to a serializer. If the serializer is a multiplexer of the commutator type, it is necessary to double latch some of the trailing bits so the updating of the 10-bit register does not interfere with the serialization, i.e. the first 6 bits 'abcdei' are updated while the last four bits 'fghj' are serialized and vice-versa. It is recommended that this double latching function be moved in front of the encoder with the bits 'FGHK' so the execution of 6B encoding and 4B encoding is staggered. Such an arrangement greatly reduces the timing demands for the generation of the S-function, the BALS6, and the UNBALS6 signals.

Analogous staggering of the 6B/5B-T and the 4B/3B-T decoding circuits can be a useful technique.

H. Disparity Circuit for 1-Byte Encoder, Fast Version

Figure 10:
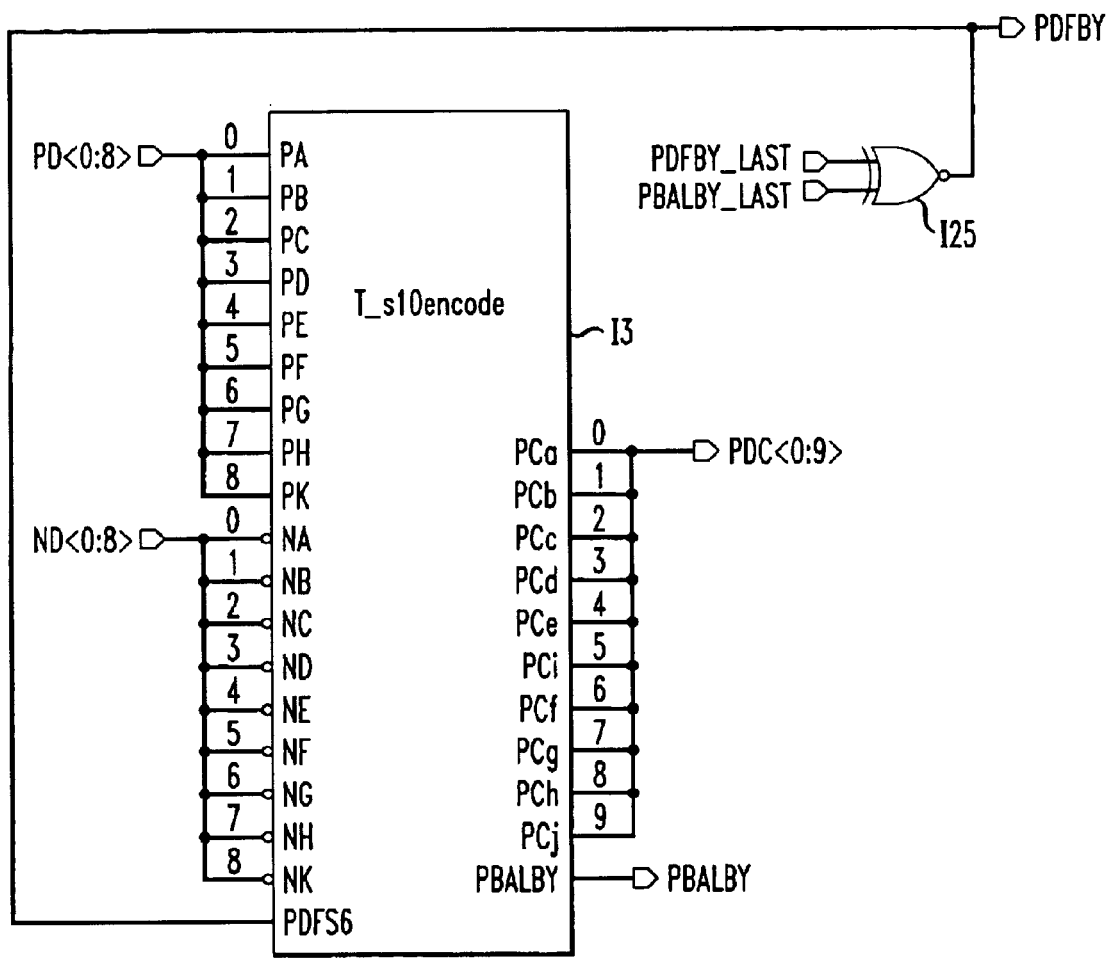
FIG. 10 illustrates exemplary circuitry using the 8B/10B-T encoder shown in FIGS. 9A and 9B to compute disparity for a single byte through a faster implementation.

Several disparity circuits are presented now. The first disparity circuit that will be described is a faster version, which is faster relative to a slower version (described below). The fast version allows encoding of a byte to take place in a single cycle. This is described in more detail in Widmer, PCT Application No. US02/13,798, entitled, "8B/10B Encoding and Decoding for High Speed Applications," filed on Apr. 30, 2002 (claiming the benefit of U.S. Provisional Patent Application No. 60/289,556, filed on May 8, 2001), which has already been incorporated by reference above. A circuit is shown in FIG. 10 for computing disparity. The circuit in FIG. 10 uses the encoding circuitry of FIGS. 9A and 9B (encompassed in module 13), along with XNOR2 (e.g., a two-input XNOR) gate I25. This circuit takes advantage of the fact that it is not necessary that the starting disparity must be known immediately for the encoding process. Since the evaluation of the running disparity at the end of a byte may be in the critical delay path, the final operations for determining the starting disparity PDFBY of the next byte are deferred to the next byte interval to be executed while initial bit encoding independent of the running disparity is performed. The cost of doing this is to pass along two parameters rather than just one to the next byte interval but it increases the timing margin by an amount equal to the delay of the XNOR2 gate I25.

The circuit diagram in FIG. 10 provides the starting disparity PDFBY and a coded byte disparity 'PBALBY' for the current byte based on these identical two parameters carried over from the preceding byte. At the end of each byte cycle, the signals PDFBY and PBALBY are stored in two latches with outputs PDFBY_LAST and PBALBY_LAST, respectively. The respective latches are not shown since their timing is identical to or closely related to the timing for the data output latches. These parameters are used for the computation of the starting disparity of the next byte. The signal PDFBY is at the upper level for a positive running disparity in front of the new byte.

There are two coded vectors per byte (6B, 4B). So if there is an odd number of balanced or unbalanced vectors between the start of the current byte and a previous byte boundary, the starting disparity for the current byte is the complement of the disparity at the reference point, otherwise it is the same.

I. Disparity Circuit for 1-Byte Encoder, Slower Version

Figure 11:
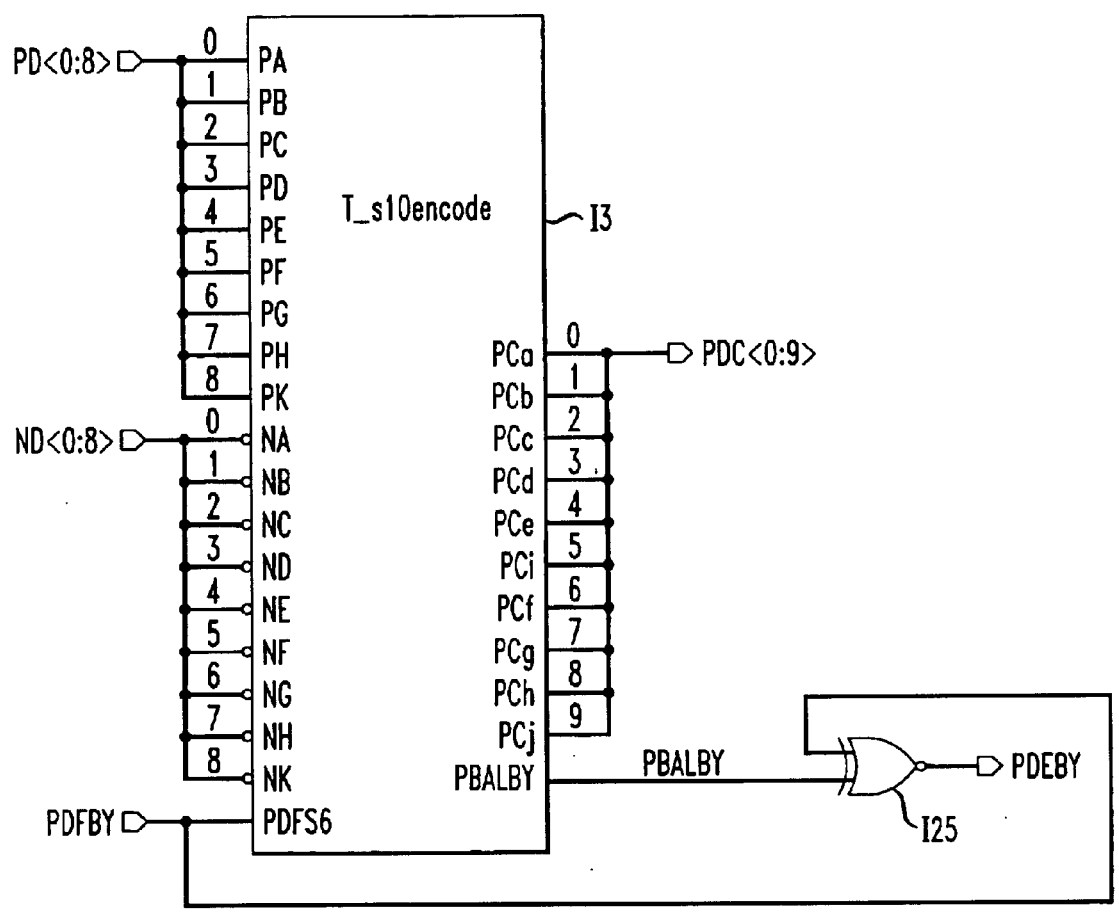
FIG. 11 illustrates exemplary circuitry using the 8B/10B-T encoder shown in FIGS. 9A and 9B to compute disparity for a single byte through a slower implementation.

To better illustrate the faster approach (e.g., shown in section H) to disparity operations, a slower disparity circuit is shown in FIG. 11 and is applicable where the higher performance is not needed. The ending disparity PDEBY is derived within one and the same encoding cycle. Then only one parameter must be passed on to the next cycle with a single latch. The data input of this latch is PDEBY and the output is PDFBY, the disparity at the front of the next byte.

J. Disparity Circuit for 4-Byte Encoder, Faster Version

Figure 12:
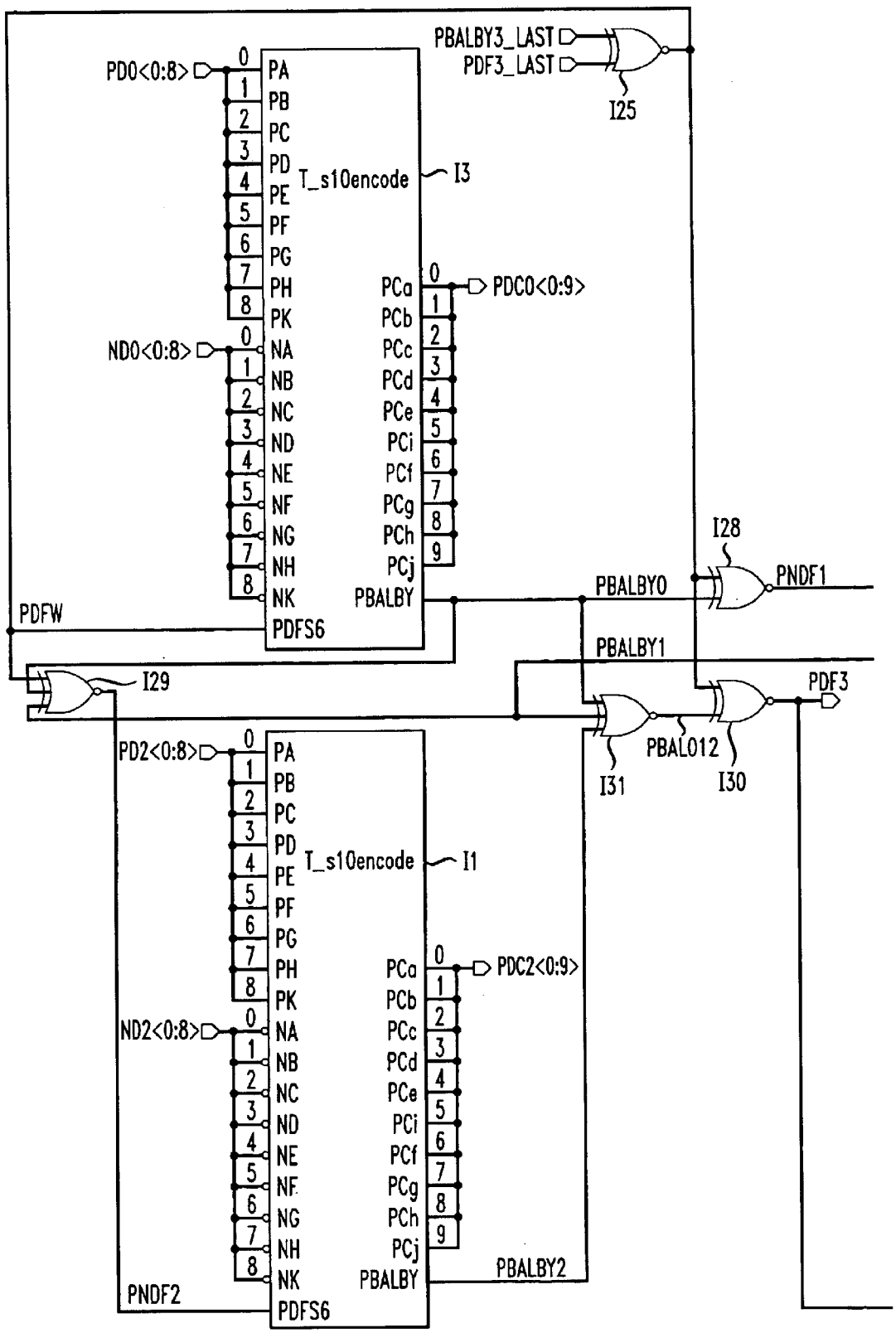
FIG. 12 illustrates exemplary circuitry using the encoder shown in FIGS. 9A and 9B to compute disparity for four bytes through a faster implementation.

A disparity circuit is shown in FIG. 12 for determining disparity for four bytes. This circuit shows four encoders operating in parallel on a 4-byte word. The modules I1, I44, I38, and I3 each encompass the encoding circuitry of FIGS. 9A and 9B. The starting disparity of the block and of the first byte is given by the input PDFW (Pos. Disp. in Front of the Word). It is generated from signals carried over from the preceding word cycle by a pair of latches (not shown), i.e., the running disparity PDF3_LAST in front of the last byte (#3) and the balance signal PBALBY3_LAST of byte #3. The starting disparity for each of the remaining three bytes is obtained by circuits operating in parallel from this reference point and the number of balanced bytes in between using a set of XOR and XNOR gates. The signal PBAL012 is at the upper level if the block comprising the first three bytes is balanced.

K. Disparity Circuit for 4-Byte Encoder, Slower Version

Figure 13:
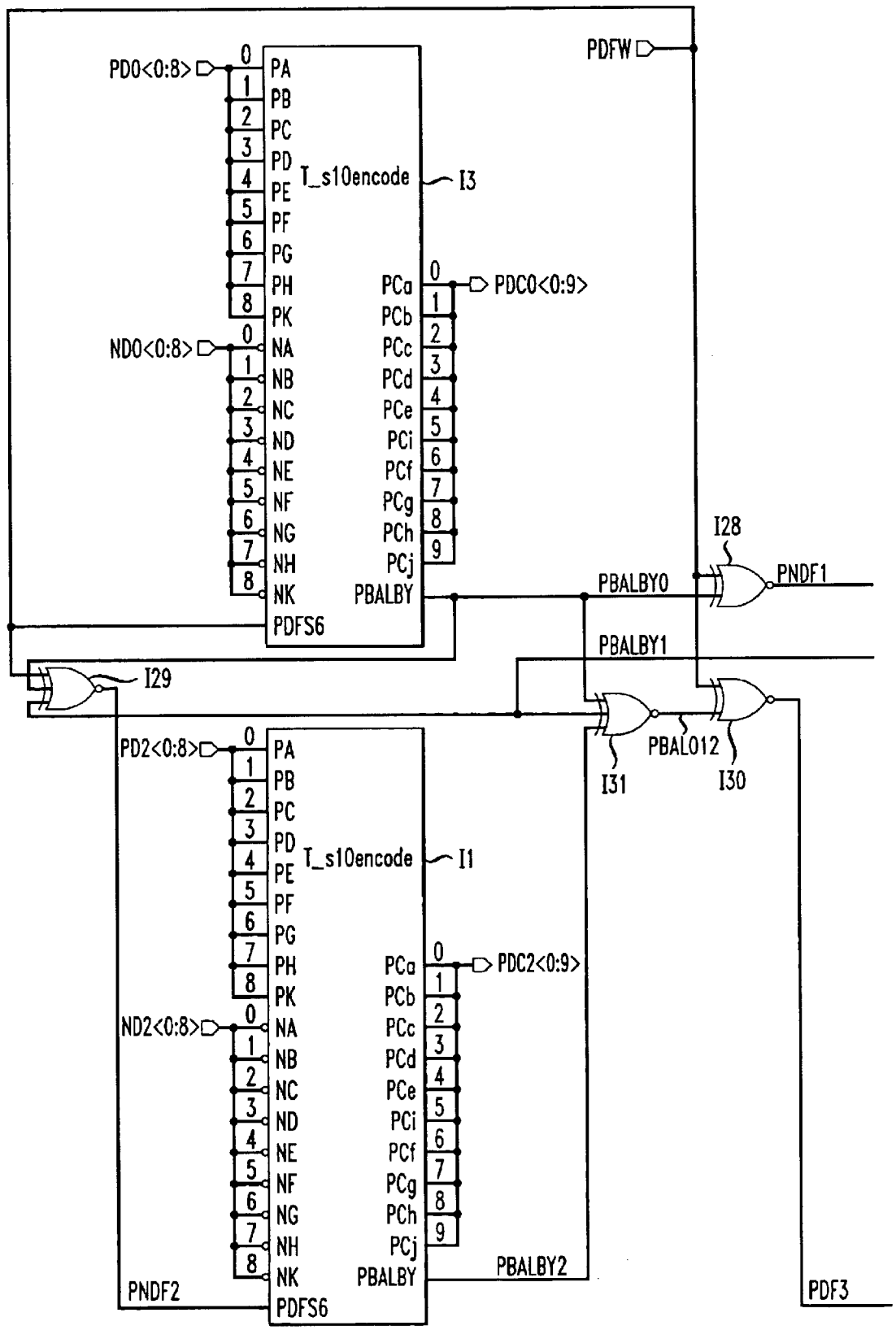
FIG. 13 illustrates exemplary circuitry using the encoder shown in FIGS. 9A and 9B to compute disparity for four bytes through a slower implementation.

A disparity circuit is shown in FIG. 13 for determining disparity for four bytes. The circuit shown in FIG. 13 is slower than the circuit shown in FIG. 12. In FIG. 13, the ending disparity PDEW of the word is generated within a single clock cycle. A single latch (not shown) with the signal PDEW at the data input passes along to the next cycle the ending disparity for the word. The output of this latch is the starting disparity PDFW for the next cycle.

L. 10B/8B-T Decoder

A 10B/8B-T decoder comprises circuits to restore the original byte ABCDEFGH K, and circuits to indicate all transmission errors to the extent that they are detectable by the transmission code. For decoding, the trailing bits 'i' and 'j' are just dropped but their value guides some of the decoding functions.

The tables in FIGS. 14 and 16 (described below) show the relationships between the coded and decoded vectors for the 6B/5B-T and 4B/3B-T decoding, respectively. For some vector names, there are several rows to represent the true and complement version and to show the different rules for the decoding of specific bits. If for a row, the equation in the column 'Decoding Class' is true, the bold, underlined bits in the column 'ABCDE K' are complemented. The suffix 'P' or 'A' of a vector name refers to the primary or alternate version of a vector, respectively.

1. 6B/5B-T Decoder

Figures 14, 14A:
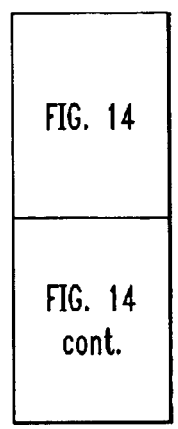
FIG. 14 is a decoding table for decoding the 6B/5B-T code portion of a 10B/8B-T transmission code according to an embodiment of the invention.
FIG. 14A illustrates the interrelationship between FIGS. 14 and 14 cont.
Figure 15A:
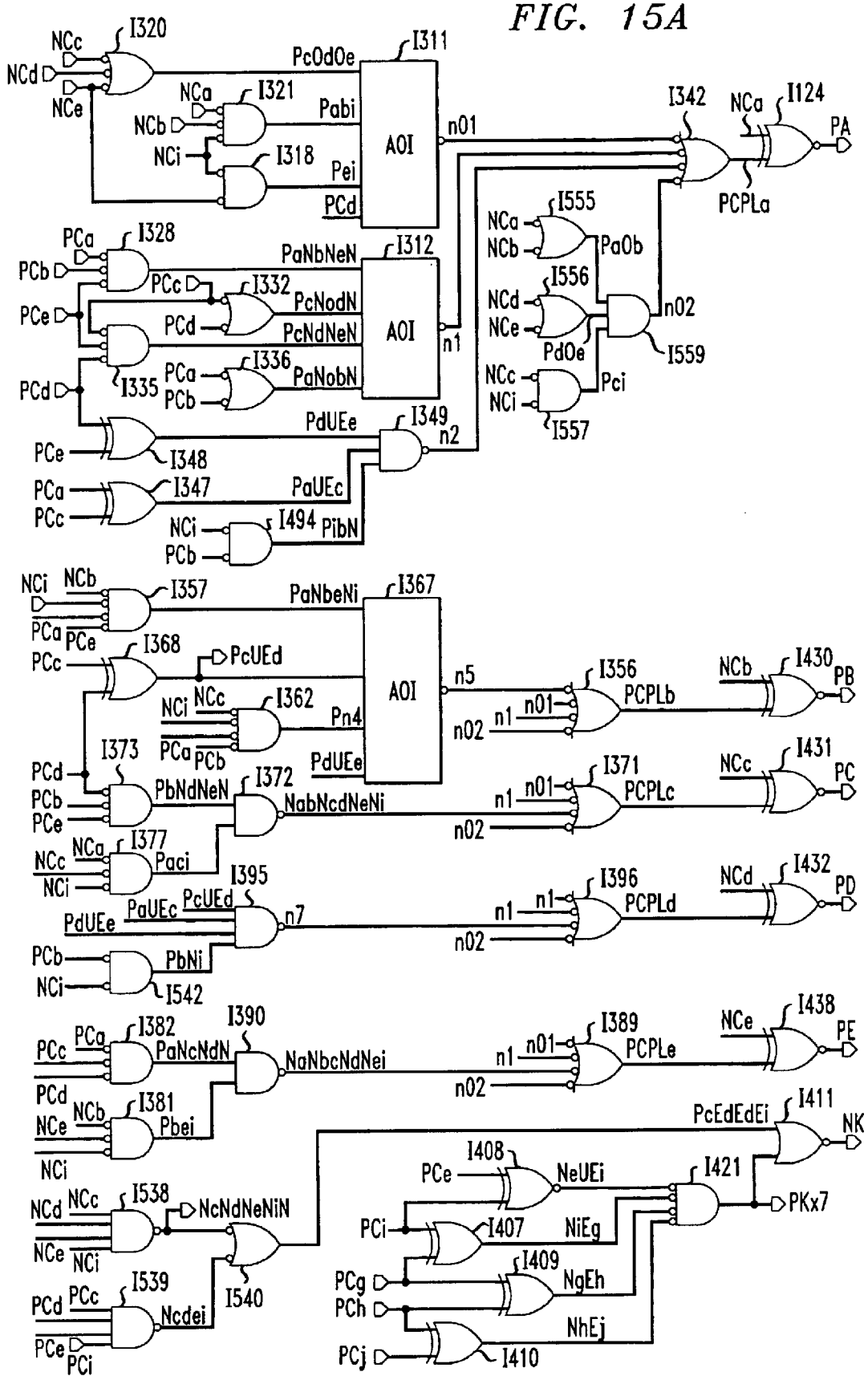
FIG. 15A is a circuit diagram of the decoding portion of a 6B/5B-T decoder according to an embodiment of the invention.
Figure 15B:
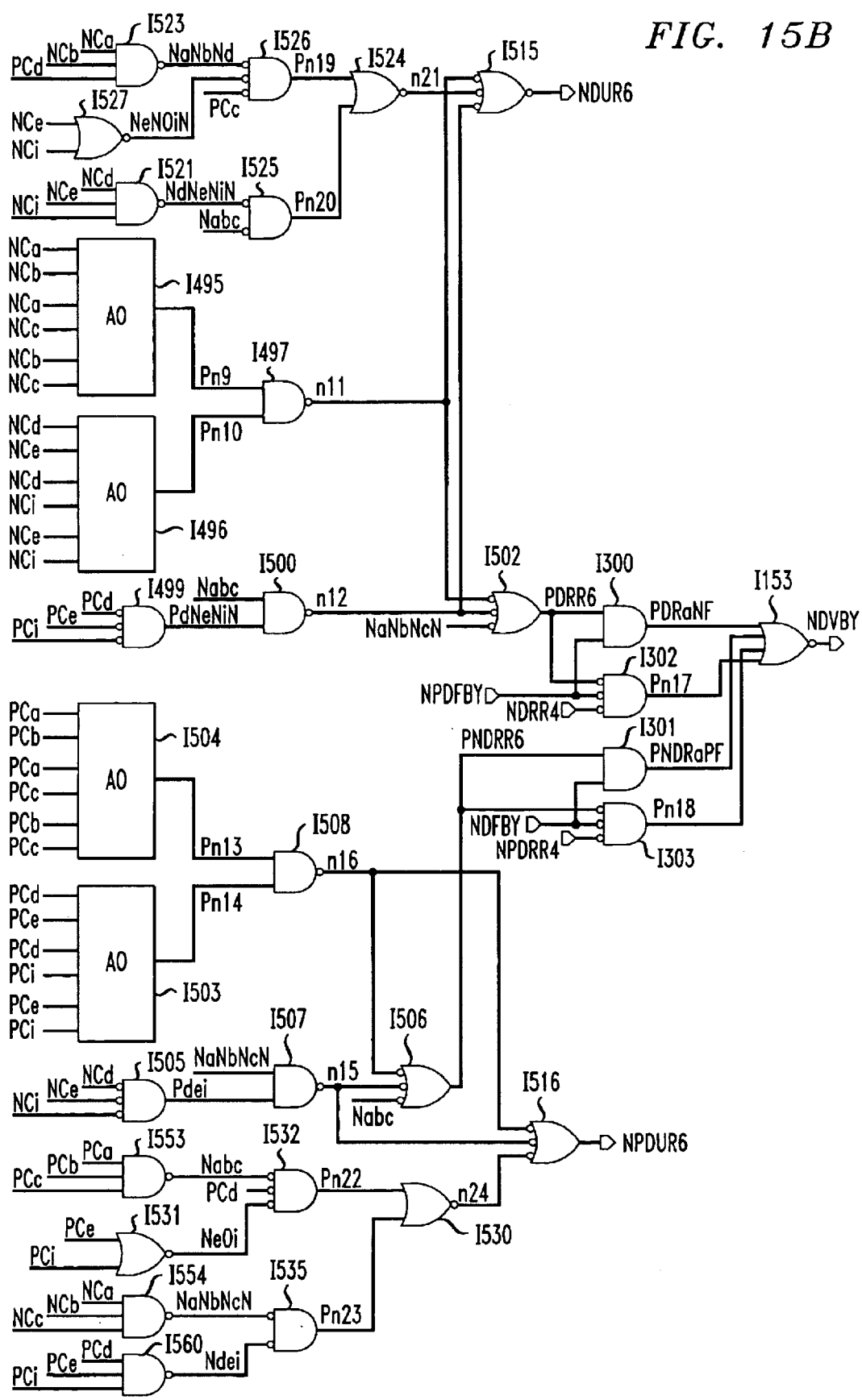
FIG. 15B is a circuit diagram of the disparity and error checking portion of a 6B/5B-T decoder according to an embodiment of the invention.
Figure 15B:
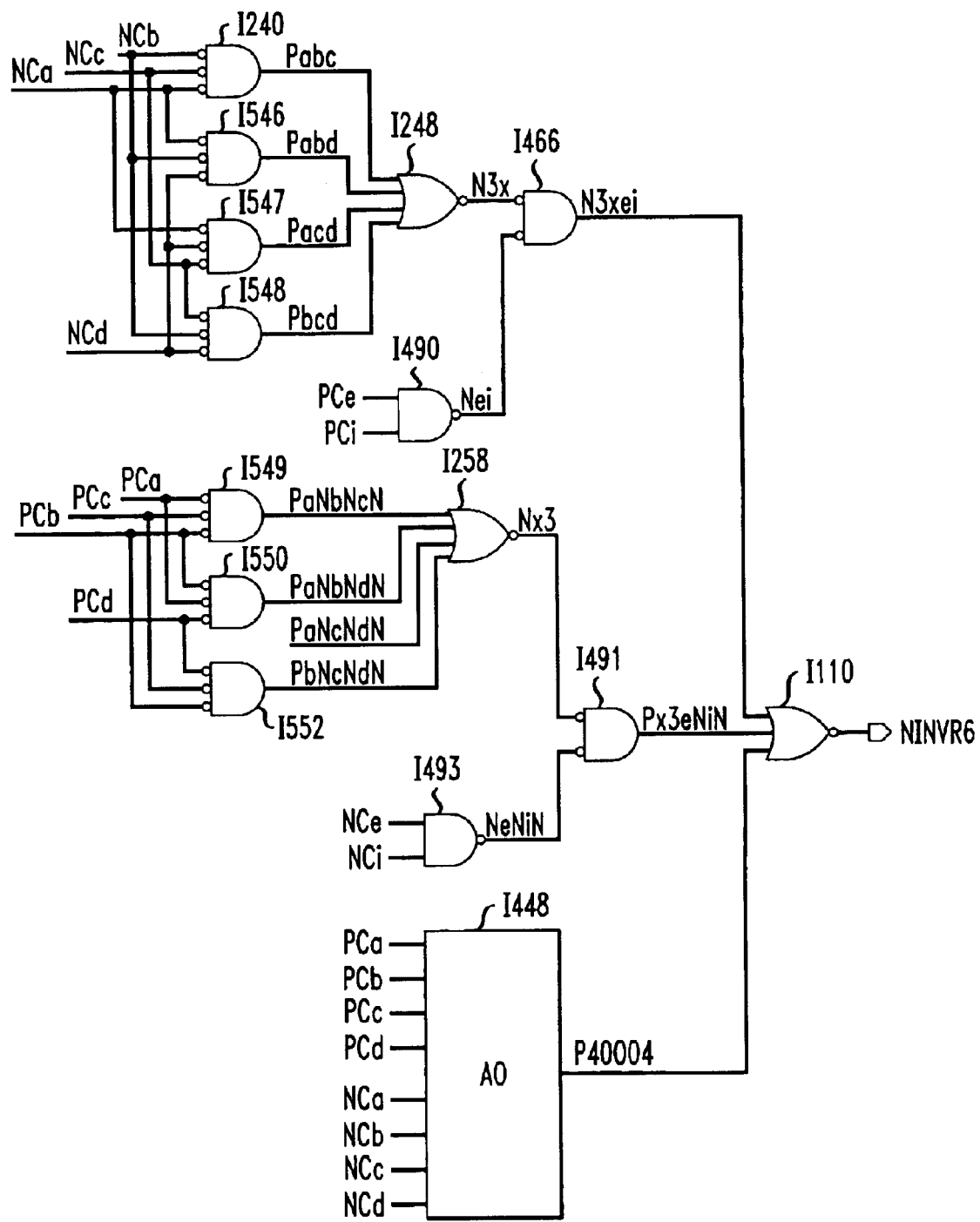

The relationship between the coded 6B vectors and the corresponding decoded 5B vectors for 6B/5B-T decoding, performed by a 6B/5B-T decoder is shown in FIG. 14. A 6B/5B-T bit decoding circuit is shown in FIG. 15A. FIG. 15B shows the corresponding disparity and error checking circuits of the decoder.

a. Inversion of the Five Leading Bits, CMPL5

Figure 3:
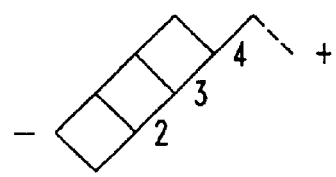
FIG. 3 is a trellis diagram illustrating a number of primary vectors of a 5B/6B-T code portion of an 8B/10B-T transmission code according to an embodiment of the invention.
Figure 4:
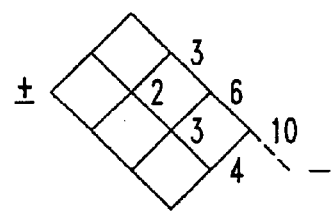
FIG. 4 is a trellis diagram illustrating a number of primary vectors of a 5B/6B-T code portion of an 8B/10B-T transmission code according to an embodiment of the invention.

If the received trailing bit 'i' has a value of one and the vector is not balanced or if the leading three bits have all a value of zero, then all the leading five bits are complemented. The complements of all valid vectors falling into this category are illustrated in FIGS. 2, 3, and 4 and their true values are listed in the 'Alternate' column of FIG. 5.

It is assumed that invalid vectors with five or six ones originated from vectors with four ones and they will be complemented as though the extra ones were not present, i.e., it is not necessary to include the zeros in the Boolean expressions for the 11 vectors below with positive disparity.

| D5 | 0 1 0 1 1 1 | D12 | 1 1 0 0 1 1 | D9  | 0 1 1 0 1 1 |
|----|-------------|-----|-------------|-----|-------------|
| D6 | 1 0 0 1 1 1 | D20 | 1 1 0 1 0 1 | D10 | 1 0 1 0 1 1 |
| D7 | 0 0 0 1 1 1 | D24 | 1 1 1 0 0 1 | D17 | 0 1 1 1 0 1 |
| K3 | 0 0 1 1 1 1 | D18 | 1 0 1 1 0 1 |     |             |

Similarly, it is assumed that invalid vectors with five or six zeros originated from sectors with four zeros and they will be complemented as though the extra zeros were not present, i.e., it is not necessary to include the ones in the Boolean expressions for the four vectors below with negative disparity.

| D/K230 | 0 0 0 1 0 1 | D/K29 | 0 1 0 0 0 1 |
|--------|-------------|-------|-------------|
| D/K270 | 0 0 1 0 0 1 | D/K30 | 1 0 0 0 0 1 |

A Boolean expression CMPL5 for the complementation of the leading five bits of the fifteen 6B vectors above is developed below:

$$CMPL5 = d \cdot e \cdot i + a \cdot b \cdot i \cdot (c+d+e) + c \cdot i \cdot (a+b) \cdot (d+e) + a' \cdot b' \cdot e' \cdot (c'+d') + c' \cdot d' \cdot e' \cdot (a'+b')$$

In the circuit diagram shown in FIG. 15A, the following net names are used:

n01 = a·b·i·(c+d+e)+d·e·i  n02 = c·i·(a+b)·(d+e)

n1 = a'·b'·e'·(c'+d')+c'·d'·e'·(a'+b')

b. Selected Bit Inversions

There are nine disparity independent vectors with an i-bit value of one. For eight of these, one or more bits in the leading five positions must be changed for decoding.

Bit A

FIG. 14 shows for which of these vectors, the first bit should be complemented:

D0 1 0 0 1 0 1

D15 0 0 1 1 0 1

D16 1 0 0 0 1 1

D31 0 0 1 0 1 1

CMPLa=CMPL5+b'·i·(a≠c)·(d≠e)
n2=b'·i·(a≠c)·(d≠e)
Bit B

| D4 | 0 1 1 0 0 1 | D15 | 0 0 1 1 0 1 |
|---|---|---|---|
| D8 | 0 1 0 1 0 1 | D31 | 0 0 1 0 1 1 |

CMPLb=CMPL5+a'·b·e'·i·(c≠d)+a'·b'·c·i·(d≠e)
n4=a'·b'·c·i
n5=a'·b·e'·i·(c≠d)+a'·b'·c≠i≠(d≠e)
Bit C
D1 1 0 1 0 0 1
CMPLc=CMPL5+a·b'·c·d'·e'·i
Bit D
D0 1 0 0 1 0 1
D31 0 0 1 0 1 1
CMPLd=CMPL5+b'·i·(a≠c)·(c≠d)·(d≠e)
n7=b'·i·(a≠c)·(c≠d)·(d≠e)
Bit E
D2 0 1 0 0 1 1
CMPLe=CMPL5+a'·b·c'·d'·e≠i
Bit K
See the table in FIG. 7: K3.x and Ky.7, where x is any number from zero to seven and y has a value of 23, 27, 29, or 30.

$$K=(c=d=e=i)+(e\neq i)\cdot(i=g=h=j)$$

The above equation is implemented as follows, because the term (c'·d'·e'·i') is also required in the 4B/3B-T decoder:

$$K=c\cdot d\cdot e\cdot i+c'\cdot d'\cdot e'\cdot i'+(e\neq i)\cdot(i=g)\cdot(g=h)\cdot(h=j)$$

c. Logic Equation for invalid Vectors R6, INVR6
There are a total of 16 invalid R6 vectors:

$$INVR6=a\cdot b\cdot c\cdot d+a'\cdot b'\cdot c'\cdot d'+P3x\cdot e\cdot i+Px3\cdot e'\cdot i'$$

$$P3x=P31+P40=a\cdot b\cdot c+a\cdot b\cdot d+a\cdot c\cdot d+b\cdot c\cdot d$$

$$P3x=P13+P04=a'\cdot b'\cdot c'+a'\cdot b'\cdot d'+a'\cdot c'\cdot d'+b'\cdot c'\cdot d'$$

Concerning notation for net names in the decoding circuit diagrams of FIGS. 15A and 15B; For the Boolean operators, the identical letters are use used as for the encoding diagrams, but they are capitalized (A, O, N, E, UE) to avoid confusion with some of the lower case letters abcdeifghj which represent the coded bits.

2. 6B/5B-T Disparity Checks
The column 'DR' of the table shown in FIG. 14 lists the required disparity at the start of the respective 6B vectors and the column 'DR Class' identifies the respective input bit patterns. In an application by Widmer, PCT Application No. US02/13,798, entitled, "8B/10B Encoding and Decoding for High Speed Applications," filed on Apr. 30, 2002 (claiming the benefit of U.S. Provisional Patent Application No. 60/289,556, filed on May 8, 2001), incorporated by reference previously, the column DU is called DB. The old column DB has been changed to DU and lists a positive or negative exit disparity for the disparity dependent vectors only. Disparity independent vectors have no entry in the DU column. In the old design, disparity independent vectors passed the input disparity to the output. In the new design, disparity independent vectors are ignored and bypassed for disparity purposes for shorter delay. Short delay is especially important for the DU outputs PDUR6 and NDUR6. To achieve the shorter delay, a dedicated column 'DU Class' has been added, which sorts the received vectors into DU classes in the most efficient way.

a. Logic Equations for Required Input Disparity DRR6
The terms PDRR6 and NDRR6 represent the R6 vectors which require a positive or negative running disparity, respectively, at the start of the vector. All invalid vectors with five or six zeros are also assigned a positive required entry disparity. Therefore, any vector with three leading zeros or four or more zeros requires a positive entry disparity. The valid vectors with positive required front end disparity are listed below.

| D7 | 0 0 0 1 1 1 | D5 | 1 0 1 0 0 0 | D9 | 1 0 0 1 0 0 |
|---|---|---|---|---|---|
| D/K23 | 0 0 0 1 0 1 | D6 | 0 1 1 0 0 0 | D10 | 0 1 0 1 0 0 |
| D24 | 0 0 0 1 1 0 | K3 | 1 1 0 0 0 0 | D12 | 0 0 1 1 0 0 |
| | | | | D17 | 1 0 0 0 1 0 |
| | | | | D18 | 0 1 0 0 1 0 |
| | | | | D20 | 0 0 1 0 1 0 |
| | | | | D/K27 | 0 0 1 0 0 1 |
| | | | | D/K29 | 0 1 0 0 0 1 |
| | | | | D/K30 | 1 0 0 0 0 1 |

Making allowance for invalid vectors, the three vectors in the left column can be identified by the Boolean expression a'·b'·c'. The three vectors in the center column are identified by d'·e'·i'·(a·b·c)'. The nine vectors in the right column have two zeros in both the leading and trailing three bit positions. Because of the inclusion of the vectors with more than four zeros, all the one bits can be ignored and the remaining vectors (valid or invalid) can be identified by the expression:

$$(a'\cdot b'+a'\cdot c'+b'\cdot c')\cdot(d'\cdot e'+d'\cdot i'+e'\cdot i')$$

Therefore:

$$PDRR6=a'\cdot b'\cdot c'+d'\cdot e'\cdot i'\cdot(a\cdot b\cdot c)'+(a'\cdot b'+a'\cdot c'+b'\cdot c')\cdot(d'\cdot e'+d'\cdot i'+e'\cdot i')$$

In the circuit diagram shown in FIG. 15B, the following net names are used:
n9=(a'·b'+a'·c'+b'·c')
n10=(d'·e'+d'·i'+e'·i')
n11=n9·n10
n12=d'·e'·i'·(a·b·c)'
The vectors with negative required front end disparity are listed below.

| D7 | 1 1 1 0 0 0 | D5 | 0 1 0 1 1 1 | D9 | 0 1 1 0 1 1 |
|---|---|---|---|---|---|
| D/K23 | 1 1 1 0 1 0 | D6 | 1 0 0 1 1 1 | D10 | 1 0 1 0 1 1 |
| D24 | 1 1 1 0 0 1 | K3 | 0 0 1 1 1 1 | D12 | 1 1 0 0 1 1 |
| | | | | D17 | 0 1 1 1 0 1 |
| | | | | D18 | 1 0 1 1 0 1 |
| | | | | D20 | 1 1 0 1 0 1 |
| | | | | D/K27 | 1 1 0 1 1 0 |
| | | | | D/K29 | 1 0 1 1 1 0 |
| | | | | D/K30 | 0 1 1 1 1 0 |

The three vectors D7, D/K23, and D24 in the left column above can be identified by the Boolean expression a·b·c. The three vectors in the center column are identified by d·e·i (a+b+c). The nine vectors in the right column are identified by the expression:

$$(a\cdot b+a\cdot c+b\cdot c)\cdot(d\cdot e+d\cdot i+e\cdot i)$$

Therefore:

NDRR6=a·b·c+d·e·i·(a+b+c)+(a·b+a·c+b·c)·(d·e+d·i+e·i)

n13=(a·b+a·c+b·c)

n14=(d·e+d·i+e·i)

n15=d·e·i·(a+b+c)

n16=n13·n14 b. Logic Equation for Monitoring Byte Disparity Violations, DVBY

Bytes with only disparity independent vectors R6 and R4 are ignored for disparity checking purposes. There is a disparity violation DVBY at a specific byte under the following conditions:

1. The required entry disparity of the R6 vector does not match the running disparity at the front of the byte.
2. The required entry disparity of the R4 vector does not match the running disparity in front of the byte and the R6 vector does not have a required entry disparity which is the complement of the required entry disparity for R4.

n17=NDRR4·PDFBY·PDRR6' n18=PDRR4·NDFBY·NDRR6'

A disparity violation internal to a byte from a disparity dependent R4 vector mismatched to a disparity dependent R6 vector is included in the set of invalid bytes, but not in DVBY. The disparity violation at a byte DVBY is thus given by the equation:

$$DVBY=NDFBY·(PDRR6+PDRR4·NDRR6')+PDFBY·(NDRR6+NDRR4·PDRR6')$$

The terms PDFBY and NDFBY represent a positive or negative running disparity, respectively, at the front of the byte and one or the other function is always true. However, for PDRR6 and NDRR6, none of the functions is true for the case of most balanced vectors.

c. Logic Equations for the assumed ending Disparities PDUR6 and NDUR6

Four leading ones or zeros in the encoded domain are invalid vectors and can be generated only by at least one error. For the case of a single error and e=i, the R6 vector was obviously one of the initially balanced vectors 011100, 101100, 110100, 111000, or their complement. Of these, all except 111000 and 000111 should not generate PDUR6 or NDUR6 which would generate a superfluous code violation at the next disparity dependent vector in addition to the invalid vector at the actual error location.

Therefore, the signal NDUR6 should be asserted in response to the following 6B inputs:

1. All bits with a value of zero (1).
2. Five bits with a value of zero (6).
3. Four bits with a value of zero except the pattern '000011' (14).
4. The pattern '111000'.

The list of these vectors is almost identical to the list above for PDRR6 except that the pattern for D7 is the complement, i.e., 111000, so the modified left column looks as follows:

D7 1 1 1 0 0 0

D/K23 0 0 0 1 0 1

D24 0 0 0 1 1 0

The vectors D/K23 and D24 above are defined by the expression:

$$n19=a'·b'·c'·d·(e^x+i')$$

The vector D7 is defined by the expression:

$$n20=a·b·c·d'·e'·i'$$

The following net name abbreviation is used in the circuit diagram shown in FIG. 15B:

$$n21=n19+n20$$

The expression for n21 replaces the term a'·b'·c' in the PDRR6 equation, therefore:

$$NDUR6=n21+d'·e'·i'·(a·b·c)'+(a'·b'+a'·c'+b'·c')·(d'·e'+d'·i'+e'·i')$$

The signal PDUR6 should be asserted in response to the following 6B inputs:

1. All bits with a value of one (1).
2. Five bits with a value of one (6).
3. Four bits with a value of one except the pattern '111100' (14).
4. The pattern '000111'.

Again, the list of these vectors is almost identical to the list above for NDRR6 except that the pattern for D7 is the complement, i.e. 000111, so the left column looks as follows:

D7 0 0 0 1 1 1

D23 1 1 1 0 1 0

K24 1 1 1 0 0 1

The three vectors above are defined by the expression n24. The following net name abbreviations are used in the circuit diagram show in FIG. 15B:

n22=a·b·c·d'·(e+i)

n23=a'·b'·c'·d·e·i n24=n22+n23

The term n24 replaces the term a·b·c in the NDRR6 equation:

Therefore:

$$PDUR6=n24+d·e·i·(a+b+c)+(a·b+a·c+b·c)·(d·e+d·i+e·i)$$

d. Circuit Simplification

The first term (D7) in each of the equations for PDUR6 and NDUR6 prevents double counts for some type of errors. However, overall some double counts are unavoidable and the added term improves the accuracy of the error count by a minuscule amount. It is debatable whether it should be dropped. A further more significant simplification is possible if the first vector (D7) is also dropped from PDRR6 and NDRR6. This may delay the error detection for some patterns by a very few bytes but does not degrade error detection per se. The circuit advantage is that with these two simplifications PDRR6 is equal to NDUR6, and NDRR6 is equal to PDUR6. Analogous simplifications are possible for the 4B/3B-T error detection, but there the circuit simplification is less compelling.

3. 4B/3B-T Decoder and Error Checks

Figure 17:
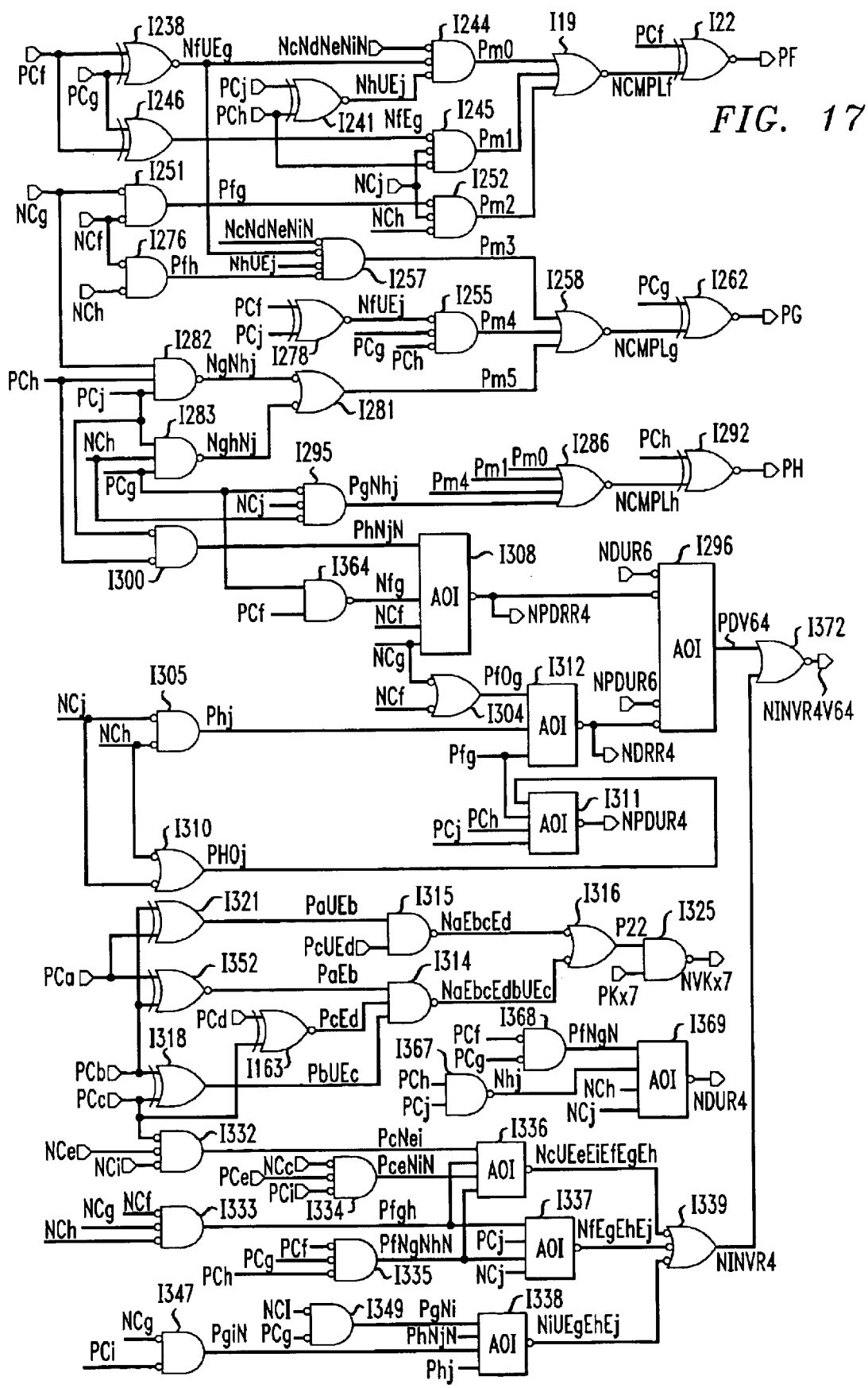
FIG. 17 is a circuit diagram of a 4B/3B-T decoder and error checks according to an embodiment of the invention.

The table in FIG. 16 shows relationships between the coded 4B vectors and the corresponding decoded 3B vectors. A decoder for 4B/3B-T decoding is shown in FIG. 17.

a. Logic Equations for the Generation of the decoded Bits F, G, H, K

Generally, F=f, G=g, H=h, except for the conditions listed below for which the complement of the respective uncoded bit is generated, e.g., H=h'.

Bit F

For 4B/3B-T decoding, the f-bit is complemented for the vectors listed below. For the four vectors in the left column, complementation is applicable only if the vectors are preceded by K3 with negative ending disparity, i.e., if c'·d'·e'·i' is true.

| | | | | | | |
|---|---|---|---|---|---|---|
| K3.0 | 1 0 1 0 | Dx/K3.2 | 1 0 1 1 | Dx/K3.7 | 0 0 0 1 | |
| K3.1 | 0 1 1 0 | Dx/K3.3 | 0 0 1 1 | Dx/K3.4 | 1 1 0 1 | |
| K3.5 | 0 1 0 1 | Dx/Ky.7 | 0 1 1 1 | | | |
| K3.6 | 1 0 0 1 | | | | | |

The left column can be characterized by $m0=(c'\cdot d'\cdot e'\cdot i')\cdot(f\ne g)\cdot(h\ne j)$.

The center column can be characterized by $m2=h\cdot j\cdot(f\cdot g)'$.

The right column can be characterized by $m1=(f=g)\cdot h'\cdot j$.

The Boolean expression CMPLf to complement the f-bit is thus:

$$CMPLf=(c'\cdot d'\cdot e'\cdot i')\cdot(f\ne g)\cdot(h\ne j)+h\cdot j\cdot(f\cdot g)'+(f=g)\cdot h'\cdot j=m0+m1+m2$$

Bit G

For 4B/3B-T decoding, the g-bit is complemented for the vectors listed below. For the three vectors in the left column, complementation is applicable only if the vectors are preceded by K3 with negative ending disparity, i.e. if $c'\cdot d'\cdot e'\cdot i'$ is true.

| | | | | | | |
|---|---|---|---|---|---|---|
| K3.1 | 0 1 1 0 | Dx/K3.2 | 1 0 1 1 | Dx/K3.7 | 0 0 0 1 | |
| K3.5 | 0 1 0 1 | Dx/K3.3 | 0 0 1 1 | Dx/Ky.7 | 1 0 0 0 | |
| K3.6 | 1 0 0 1 | Dx/K3.0 | 0 1 0 1 | | | |
| | | Dx/K3.4 | 1 1 0 1 | | | |

The left column can be characterized by $(c'\cdot d'\cdot e'\cdot i')\cdot(f\ne g)\cdot(h\ne j)\cdot(f\cdot h)'=m0\cdot(f\cdot h)'$ The center column can be characterized by $m5=g'\cdot h\cdot j+g\cdot h'\cdot j$.

The right column can be characterized by $m4=(f\ne j)\cdot g'\cdot h'$.

The Boolean expression CMPLg to complement the f-bit is thus:

$$CMPLg=(c'\cdot d'\cdot e'\cdot i')\cdot(f\ne g)\cdot(h\ne j)\ne(f\cdot h)'+g'\cdot h\cdot j+g\cdot h'\cdot j+(f\ne j)\cdot g'\cdot$$

$$CMPLg=m0\cdot(f\cdot h)'+m4+m5$$

Bit H

For 4B/3B-T decoding, the h-bit is complemented for the vectors listed below. For the four vectors in the left column, complementation is applicable only if the vectors are preceded by K3 with negative ending disparity, i.e., if $c'\cdot d'\cdot e'\cdot i'$ is true.

| | | | | | | |
|---|---|---|---|---|---|---|
| K3.0 | 1 0 1 0 | Dx/K3.2 | 1 0 1 1 | Dx/K3.7 | 0 0 0 1 | |
| K3.1 | 0 1 1 0 | Dx/K3.3 | 0 0 1 1 | Dx/K3.4 | 1 1 0 1 | |
| K3.5 | 0 1 0 1 | | | Dx/Ky.7 | 1 0 0 0 | |
| K3.6 | 1 0 0 1 | | | | | |

The left column is identical to what is listed under Bit F above and can be characterized by $m0=(c'\cdot d'\cdot e'\cdot i')\cdot(f\ne g)\cdot(h\ne j)$.

The center column can be characterized by $g'\cdot h\cdot j$.

The right column can be characterized by $(f=g)\cdot h'\cdot j+(f\ne j)\cdot g'\cdot h'=m1+m4$, where the second term includes Dx/K3.7 redundantly to reuse an expression already available from bit g decoding.

The Boolean expression CMPLh to complement the h-bit is thus:

$$CMPLh=(c'\cdot d'\cdot e'\cdot i')\cdot(f\ne g)\cdot(h\ne j)+g'\cdot h\cdot j+(f=g)\cdot h'\cdot j+(f\ne j)\cdot g'\cdot h'$$

$$CMPLh=m0+m1+m4+g'\cdot h\cdot j$$

b. Logic Equations for the required Disparity at the Front of the R4 Vector

The terms PDRR4 and NDRR4 represent the required positive or negative disparity, respectively, at the front of the R4 vector.

A total of six 4B vectors require a positive disparity PDRR4 at the front:

1. All four bits have a zero value which is an invalid vector.
2. There is a single one bit in the 4-bit vector.
3. The vector 0011.

The first and the third condition are met by $f'\cdot g'$ which also overlaps the second condition. The second condition is met by $m6=(f\ne g)\cdot h'\cdot j'$. Therefore, $$PDRR4=f'\cdot g'+m6$$

A total of six 4B vectors require a negative disparity NDRR4 at the front:

1. All four bits have a one value which is an invalid vector.
2. There is a single zero bit in the 4-bit vector.
3. The vector 1100.

$$NDRR4=f\cdot g+(f+g)\cdot h\cdot j$$

c. Logic Equations for the assumed ending Disparities PDUR4 and NDUR4

A total of six 4B vectors have a positive ending disparity PDUR4:

1. All four bits have a one value which is an invalid vector.
2. There is a single zero bit in the 4-bit vector.
3. The vector 0011.

$$PDUR4=h\cdot j+f\cdot g\cdot(h+j)$$

A total of six 4B vectors have a negative ending disparity NDUR4:

1. All four bits have a zero value which is an invalid vector.
2. There is a single one bit in the 4-bit vector.
3. The vector 1100.

$$NDUR4=h'\cdot j'+f'\cdot g'\cdot(h\cdot j)'$$

d. Logic Equation for invalid Vector R4, INVR4

There are a total of two inherently invalid R4 vectors: all ones or all zeros (f=g=h=j). Some combinations of R6 and R4 vectors are invalid, such as violations of the S-function rules (c≠e=i=f=g=h), which represents a false comma, and the bit configuration (i≠g=h=j) which can generate another false comma. These invalid R4 vectors are lumped together in the signal INVR4:

$$INVR4=(f=g=h=j)+(c\ne e=i=f=g=h)+(i\ne g=h=j)$$

The nine Kx.7 control characters shown in the table in FIG. 8 are not implemented in the circuit designs shown and therefore classified as invalid characters. The R6 part of these characters is derived from 5-bit source vectors of the P22 class, which have two ones and two zeros in the first four bit positions, and additionally they have complementary bits in the last two positions. So an invalid Kx.7 control character is present, if the following conditions are met:

$$VKx7=(i\cdot g\cdot h\cdot j+i'\cdot g'\cdot h'\cdot j')\cdot(e\ne i)\cdot P22$$

Where $P22=(a\ne b)\cdot(e\ne d)+(a=b)\cdot(c=d)\cdot(b\ne c)$

If the required entry disparity DRR4 does not match the exit disparity DUR6 of a disparity dependent R6 vector, an invalid character is flagged by the signal DV64 under the following conditions:

$$DV64=PDRR4 \cdot NDUR6+NDRR4 \cdot PDUR6$$

The signal INVR4V64 is the OR function of INVR4 and DV64.

4. 10B/8B-T Decoder, Error Checks

Figure 18:
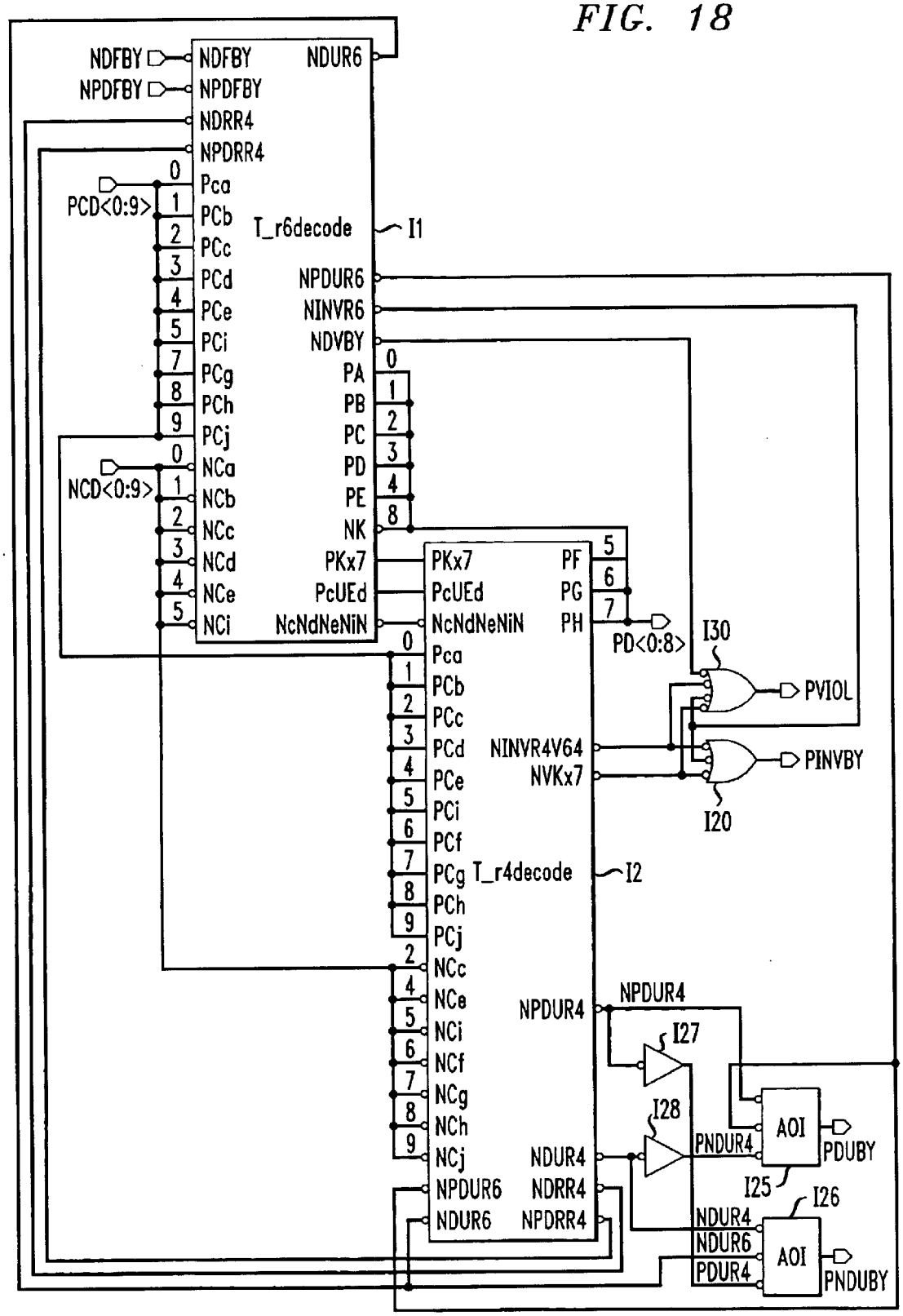
FIG. 18 is a circuit diagram of a 10B/8B-T decoder using the 6B/5B-T decoder of FIGS. 15A and 15B and the 4B/3B-T decoder of FIG. 17.

A 10B/8B-T decoder is shown in FIG. 18.

a. Error Reporting

The circuit shown in FIG. 18 merges the 6B/5B-T and 4B/3B-T decoders into a byte decoder and generates the signal INVBY, which indicates an inherently invalid byte that includes disparity violations DV64. These violations are evident from an examination of just the 10 coded bits of the current byte. The output INBY is provided for support of certain error correction techniques which require the identification of the erroneous byte. The signal VIOL signals either an invalid byte or a disparity violation DVBY detected at this location which may result from an error in this or a preceding byte. The circuit delays for DVBY and VIOL are the longest for the decoder. Fortunately, for many applications these outputs can be reported during the next byte cycle with no adverse impact, i.e., pipe-lining limited to these circuits is possible.

b. Disparity Monitoring

If either one or both of the vectors are disparity dependent, either PDUBY or PNDUBY are asserted to establish a positive or negative running disparity, respectively, at the end of the byte:

$$PDUBY=PDUR4+PDUR6 \cdot NDUR4'$$

$$NDUBY=NDUR4+NDUR6 \cdot PDUR4'$$

5. Byte Disparity, Fast Version

Figure 19:
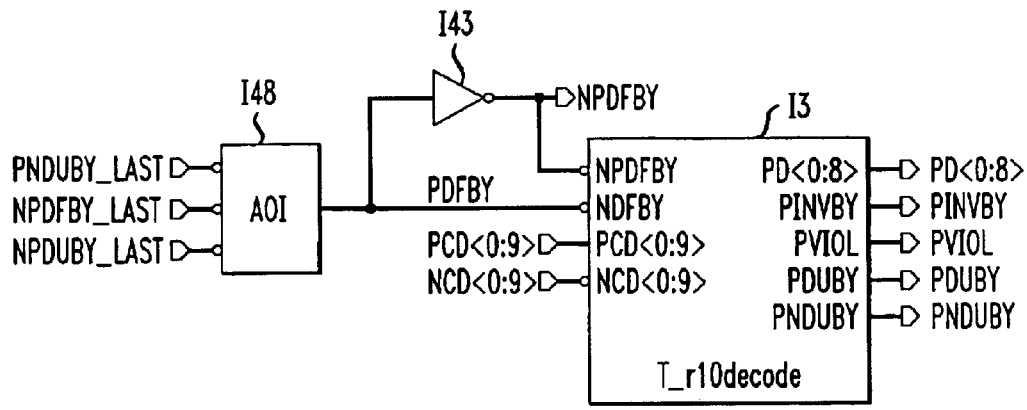
FIGS. 19 and 20 illustrate exemplary circuitry using the 8B/10B-T decoder shown in FIG. 18 to compute disparity for a single byte through faster and slower, respectively, implementations.

FIG. 19 shows circuitry for computing disparity for a single byte by using the decoder of FIG. 18. This circuit computes the disparity in a relatively fast manner, as compared to a circuit described below. Notation is as follows: The signal names PDFBY and NDFBY refer to a positive and negative running disparity, respectively, in front of the byte. The signal names PDUBY and NDUBY refer to the assumed positive or negative exit disparity, respectively, of the byte, regardless of the starting disparity at the front end. If neither the 6B vector nor the 4B vector of the byte is disparity dependent, none of the two outputs is asserted.

The values for the outputs NPDFBY, PDUBY, and PNDUBY are stored in three latches (not shown in the diagrams) which are clocked concurrently with the decoded data output. The outputs of the latches are labelled NPDFBY_LAST, NPDUBY_LAST (from pin L2N, the inverted output of the slave latch L2), and PNDUBY_LAST, respectively, and are used for the computation of the starting disparity PDFBY for the next byte.

6. Logic Equations for the Determination of the Disparity at the Start of the Byte $$PDFBY=PDUBY\_LAST+PDFBY\_LAST \cdot NDUBY\_LAST$$

Note that NDFBY and PDFBY are complementary: NDFBY=PDFBY' and the values of PDUBY and NDUBY are exclusive, none or one alone can be true.

7. Byte Disparity, Slower Version

Figure 20:
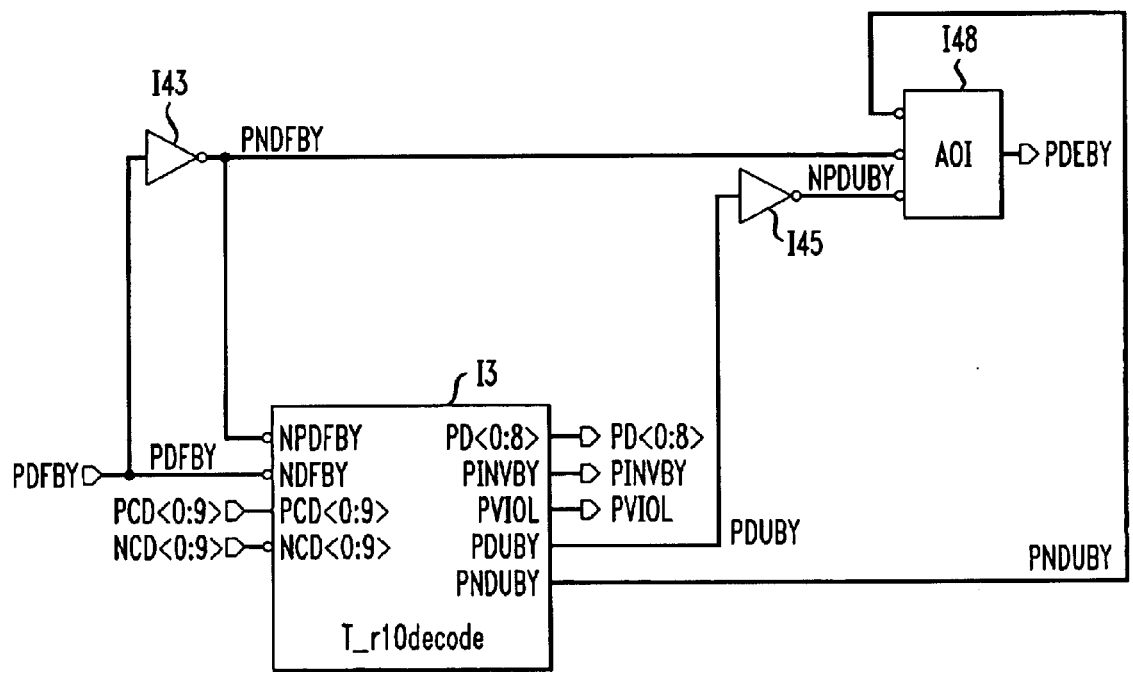

FIG. 20 shows circuitry for computing disparity for a single byte by using the decoder of FIG. 18. This circuit computes the disparity in a relatively slow manner. The incentive to use the slower version is the saving of two latches. If timing is not critical, the ending disparity PDEBY is generated in the same cycle as the decoding and the error checks. So only this single parameter must be passed on to next byte in the traditional manner. The output of this latch is the signal PDFBY, the disparity in front of the new byte. If the longest delay path is to the PDEBY output, the critical path delays have then been increased by one inverter plus one OAI21 gate delay.

8. Four-Byte Word Decoder

Figure 21:
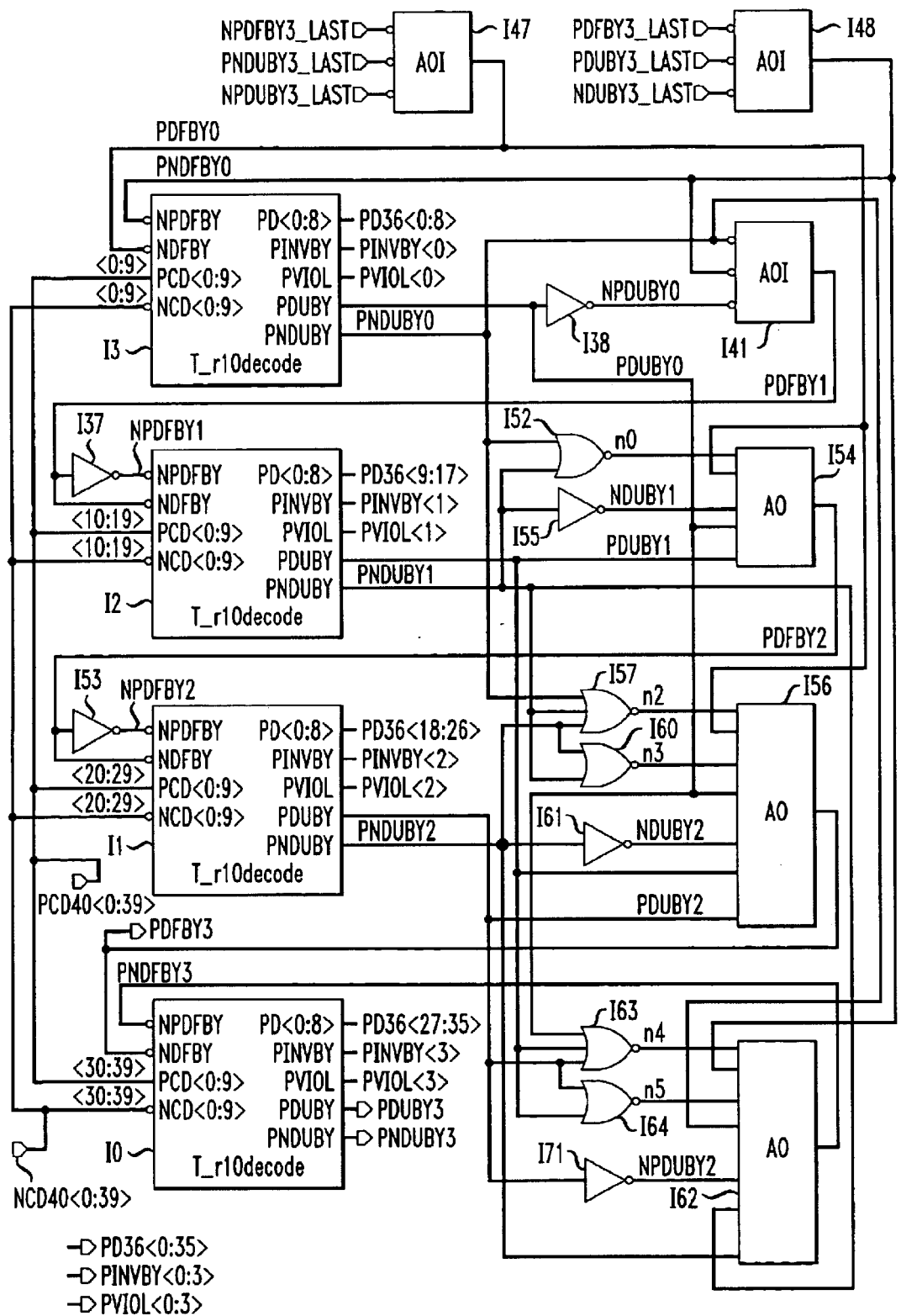
FIG. 21 is a four-byte 10B/8B-T decoder.

A four-byte word decoder is shown in FIG. 21.

a. Notation

The signal names PDFBY0 and NDFBY0 refer to a positive and negative disparity, respectively, in front of byte #0.

The signal names PDUBY0 and NDUBY0 refer the assumed positive or negative exit disparity, respectively, of byte #0. If neither the 6B vector nor the 4B vector of the byte is disparity dependent, none of the two outputs is asserted.

The values for the outputs PDFBY3, PDUBY3, and PNDUBY3 are stored in the latches with the complementary outputs PDFBY3_LAST/NPDFBY3_LAST, PDUBY3_LAST/NPDUBY3_LAST, and PNDUBY3_LAST/NDUBY3_LAST, respectively, for the computation of the starting disparities PDFBY0 and PNDFBY0 for the next word cycle at the top of the diagram.

b. Logic Equations for the Determination of the Disparity at the Start of the Bytes $$PDFBY0=PDUBY3\_LAST+PDFBY3\_LAST \cdot NDUBY3\_LAST$$

$$NDFBY0=NDUBY3\_LAST+NDFBY3\_LAST \cdot PDUBY3\_LAST$$

The values of PDFBY0 and NDFBY0 are complementary, but the values of PDUBY3 and NDUBY3 are exclusive, none or one alone can be true.

To minimize the circuit delays, the disparity values for the front of byte #1, #2, and #3 are determined not sequentially from byte to byte, but based on the disparity in front of byte #0 and the changes in disparity contributed by the byte(s) in between.

$$PDFBY1=PDUBY0+PDFB0 \cdot NDUB0'$$

$$NDFBY1=NDUBY0+NDFB0 \cdot PDUBY0'$$

$$PDFBY2=PDUBY1+PDUB0 \cdot NDUB1'+PDFBY0 \cdot NDUBY0' \cdot NDUBY1'$$

$$n0=NDUBY0+NDUBY1$$

$$PDFBY2=PDUBY1+PDUB0 \cdot NDUB1'+PDFBY0 \cdot n0'$$

$$NDFBY2=NDUBY1+NDUBY0 \cdot PDUBY1'+NDFBY0 \cdot PDUBY0' \cdot PDUBY1'$$

$$n1=PDUBY0+PDUBy1$$

$$NDFBY2=NDUBY1+NDUBY0 \cdot PDUBY1'+NDFBY0 \cdot n1'$$

$$PDFBY3=PDUBY2+PDUBY1 \cdot NDUBY2'+PDUBY0 \cdot NDUBY1' \cdot NDUBY2'+PDFBY0 \cdot NDUBY0' \cdot NDUBY1' \cdot NDUBY2'$$

$$n2=NDUBY0+NDUBY1+NDUBY2$$

$$n3=NDUBY1+NDUBY2$$

$$PDFBY3=PDUBY2+PDUBY1 \cdot NDUBY2'+PDUBY0 \cdot n3'+PDFBY0 \cdot n2'$$

$$NDFBY3=NDUBY2+NDUBY1 \cdot PDUBY2'+NDUBY0 \cdot PDUBY1' \cdot PDUBY2'+$$

$NDFBY0 \cdot PDUBY0' \cdot PDUBY1' \cdot PDUBY2'$ $n4 = PDUBY0 + PDUBY1 + PDUBY2$ $n5 = PDUBY1 + PDUBY2$ $NDFBY3 = NDUBY2 + NDUBY1 \cdot PDUBY2' + NDUBY0 \cdot n5 + NDFBY0 \cdot n4'$ In the circuit implementation of FIG. 21, the following relationships may be taken advantage of:

PNDFBYL=PDFBY1'

PNDFBY2=PDFBY2'

These signals are not in the critical path and the added inversion does not decrease the maximum rate. For applications which have sufficient timing margin, the same simplifications can also be used for the signal PNDFBY3 and perhaps PNDFBY0 at a penalty of one inversion for each of those two signals.

M. 5B/6BT Code and Partitioned 10B/12B Code

Some applications are compatible with modulo 5-bit data units. Plain data can be transmitted in modulo five format by just concatenating 6B vectors as defined above. However, in the 6-bit domain there is no comma character defined. Synchronization must be accomplished by other means. To gain access to comma characters, the code should be viewed as a 10B/12B code, but actual operation can easily shift from one mode to the other. A compatible partitioned 10B/12B transmission code can be constructed from concatenated pairs of 6B vectors with identical definitions as defined in FIG. 5. A difference between a 5B/6B-T and the 10B/12B code is the availability of a comma and a larger set of control characters in the 12B format. For purposes of special, non-data characters, for example a comma, the 5B/6B-T code is expanded to a 10B/12B code using a pair of contiguous 6B vectors (2×5B/6B-T=10B/12B). For an example, refer to FIG. 22, where $(a_0 b_0 c_0 d_0 e_0 i_0)$ and $(a_1 b_1 c_1 d_1 e_1 i_1)$ are needed to define these characters. The comma-character is a special character of interest. It can be used to mark and recover quickly, and to monitor the 6B, 12B, and packet boundary alignments for each individual link in a parallel bus configuration regardless of the skew of the several transmission lanes.

Figure 22:
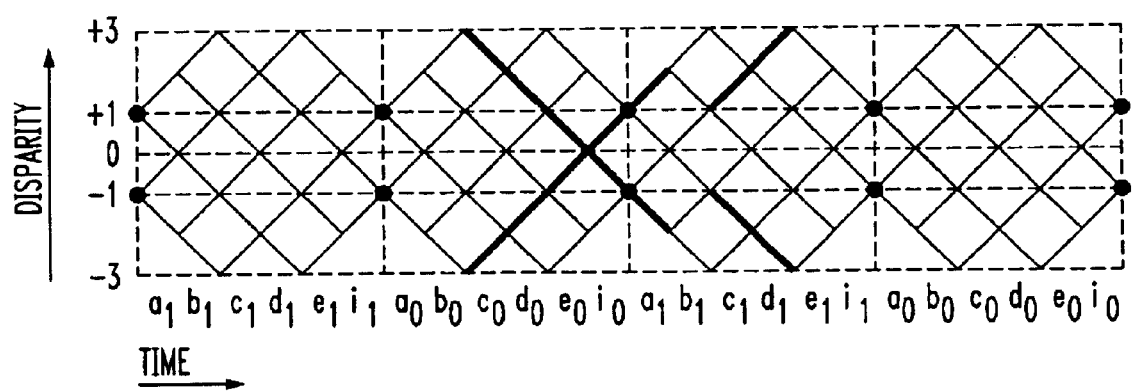
FIG. 22 is a trellis diagram of a 10B/12B-T transmission code.

Keeping in mind that for data neither the first four bits nor the last four bits of a 6B vector can be identical, the 5B/6B-T and the 10B/12B codes can easily be evaluated with the help of the trellis diagram of FIG. 22 and its characteristics can be summarized as follows:

1. The maximum run length (RL) is five with at most two contiguous runs of five in data mode, e.g, +011100+000111+110001+. Three contiguous runs of five are generated if the first two 6B vectors of the above example are followed by the comma character or certain other control characters: +011100+000111+110000−010011−.

2. For start-up purposes, the coding circuitry can generate a steady stream of runs of six, i.e. a symmetrical waveform at one twelfth the baud rate. The waveform "−110000'001111−110000'001111− . . . " is obtained by holding the encoder input at a steady K3 value (00111 K=1). The waveform "−1111100'000011−111100'000011− . . . " is obtained by holding the encoder input at a steady K15 (11110 K=1) value (refer to FIG. 23). These waveforms can be used to adjust the receiver circuits on parallel lanes to deal with skew and/or to find the 6B boundaries.

3. The minimum sustainable average transition density is three per 12-bit coded data interval, for example, the bit pattern '+100001−111000−011110+000111+' can be repeated indefinitely. Any single 12-bit interval may have as few as two transitions.

4. The code is dc-balanced with a maximum digital sum variation or running disparity variation of ±3. In the steady-state condition (ignoring irrelevant start-up abnormalities), all 6B vectors start and end with a running disparity of ±1.

5. The normalized maximum dc-offset is (13/6)=2.17 versus 1.9 for the 8B/10B-T code. The normalized maximum dc-offset is derived from the trellis diagram and is defined as the average area (bit interval x disparity) per bit-interval enclosed between the zero-disparity line and the outermost contour any valid code vector can traverse, which is '+110100+' or '−001011−' for the 5B/6B-T code. It is a better indicator for the low frequency behavior than the traditional DSV parameter. By simulations, it can be shown that at a 2 Gbaud rate, a 3 dB low frequency cutoff at 3.9 MHz (0.195% of Baud rate) produces an eye amplitude closure of 0.5 dB. A cutoff at 7.9 MHz generates a closure penalty of 1 dB for a worst case pattern. It is generally desirable to operate with a high low frequency cut-off in order to filter out low frequency noise from several sources and to permit small reactance values for ac-coupling. As an example, optical receiver designs usually have at least one high-pass filter on chip and so it is very important to reduce the size of the required capacitance. For equivalent results, the low frequency cut-off for the 5B/6B-T code must be set about 5.5% lower than for a conventional 8B/10B or the 8B/10B-T code described herein.

6. The maximum error spread caused by an error in the coded data is five contiguous decoded bits.

1. Coding Constraints and 12B Control Characters

A total of fifty-seven 12B control characters can be defined if needed without violating the existing run length and disparity constraints. A first set of 28 control characters is identified by K3 (110000 or 001111) in the first half segment, followed by the set of 15 balanced vectors which do not generate a run of six across the center division line. All these balanced 6B vectors are made disparity dependent as shown in the table shown in FIG. 23. Thirteen unbalanced 6B vectors also meet the constraints. Beyond that, one can define a new special 6B vector K15 with a leading run of four as listed in the table shown in FIG. 23. This vector is restricted to the second half of the 12B characters. So K3 followed by K15 yields another 12B control character which can be recognized as such by the presence of a special vector in either half-segment. A second set of 28 control characters is identified by the presence of K15 in the second half segment and the first half segment restricted to vectors which do not generate a run of six across the center boundary. Essentially, this second set is the first set of 12B characters with reversed bit order in the coded domain. Interestingly, there is also a second comma character with the same alignment with respect to the 12B boundaries, but the comma sequence is in reverse order ('110010000011' or '001101111100'). The definitions for the second set of 28 control characters are not included in the table shown in FIG. 23.

2. Comma Sequence for the 10B/12B Code

The preferred comma patterns is '11111011' or its complement '00000100'. The complete 12-bit comma character is "+110000 010011−" or "−001111 101100+" and it is generated by K3.K2 with some coder circuit modification to complement K2 in special characters when the starting disparity is positive. In the absence of errors, it is sufficient to monitor the seven bold digits for comma detection. An alternate comma pattern is the above bit sequence in reverse order "+1 10010 000011–" or "–001101 111100+".

Once vector alignment at the receiver has been established, both the 5B/6B-T and the 10B/12B code operate identically for data. The only differences are related to control characters and the comma sequence. Of course, alignment can be established by means other than a comma, e.g., a check for coding violations and step by step changes in alignment, or with the sequence of runs of six as described in list item 2 just above.

3. Implementation

In the circuit example described here, a limited set of fourteen 12B vectors is implemented to keep the circuits simple. The table shown in FIG. 24 lists the 6B vectors which may follow contiguously the special character K3 to form a 12B control character. With this limited set, only K2 and K3 are handled differently from their normal data mode D2 and D3, respectively, for encoding and decoding. K2 is a balanced vector made disparity dependent to form a comma sequence together with the preceding K3 character regardless of the running disparity at the start of K3. K3 has already been described as part of the 8B/10B-T code.

4. 5B/6B-T Encoding for 10B/12B Format

Figure 25A:
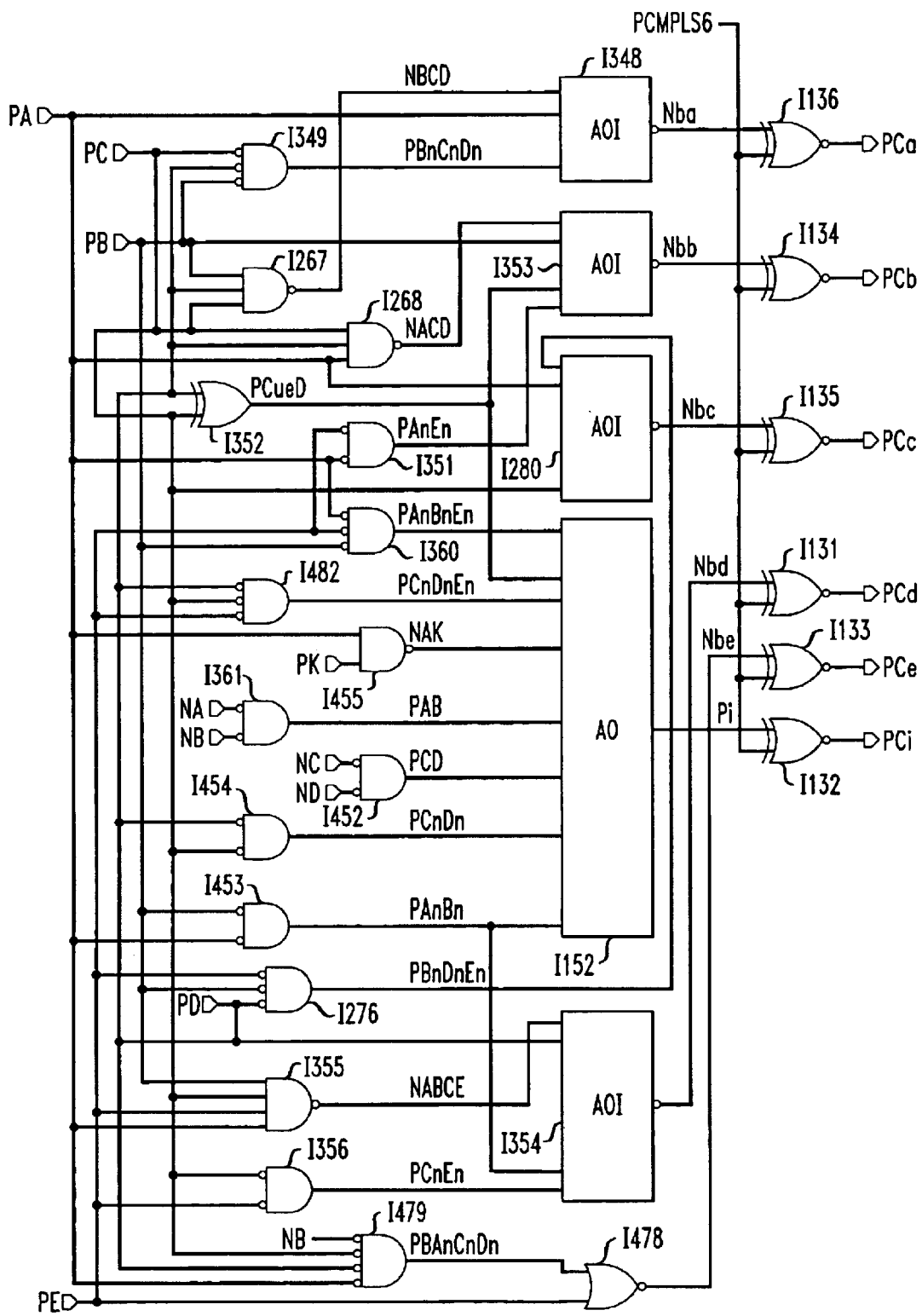
FIG. 25A is a circuit diagram for the 5B/6B-T portion of the bit encoding of a 10B/12B encoder.
Figure 25B:
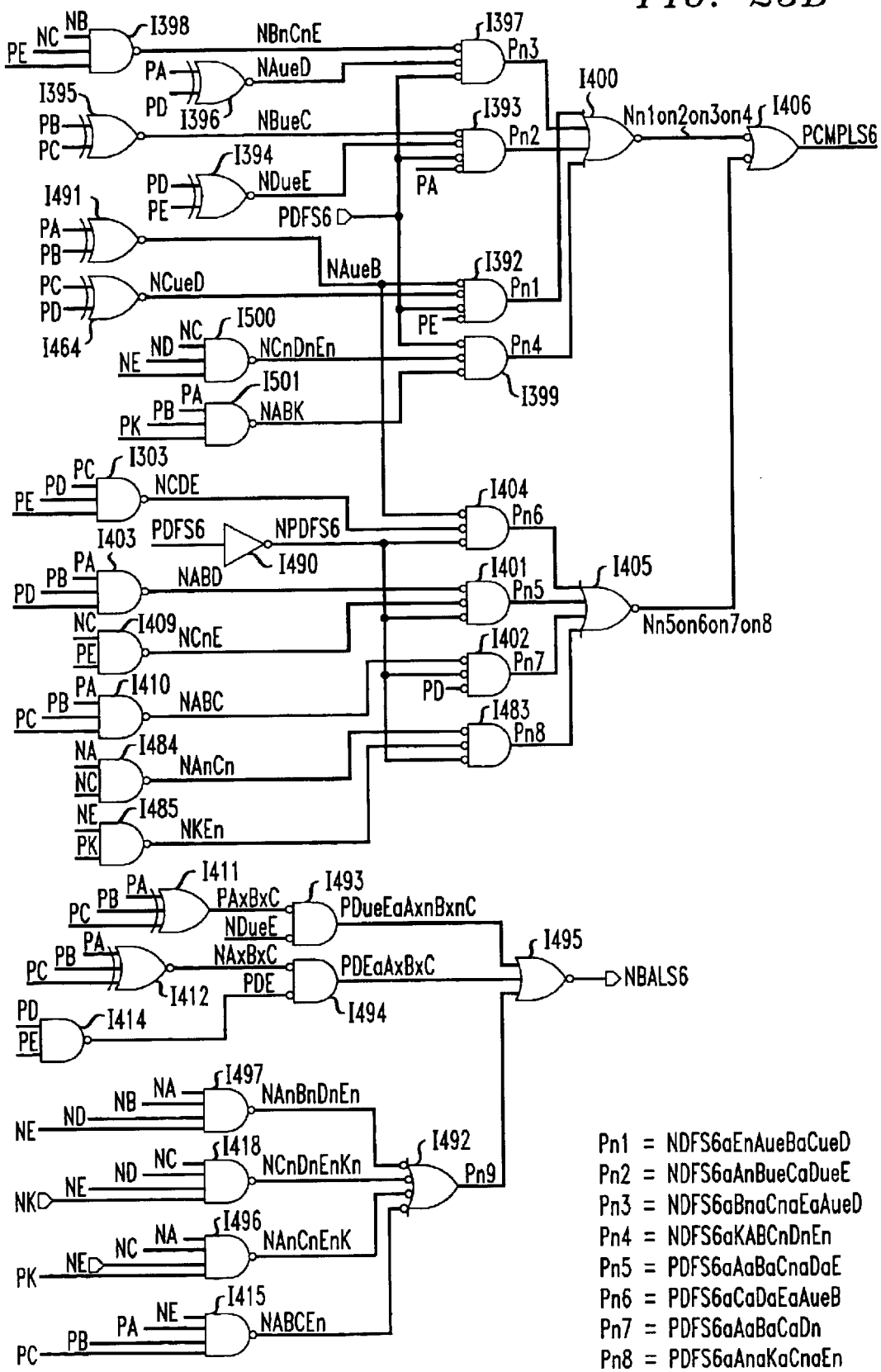
FIG. 25B is a circuit diagram of the disparity control portion of the 10B/12B encoder.

An encoding portion of a 10B/12B encoder is shown in FIG. 25A, while FIG. 25B shows a disparity control portion of the 10B/12B encoder. The AO block 1152 and AOI blocks I348, I353, I280, and I354 are AND-OR and AND-OR-INVERT blocks, respectively, as described above in reference to FIGS. 9A and 9B. The circuit shown in FIGS. 25A and 25B takes a five-bit source vector defined by PA, PB, PC, PD, and PE and creates a six-bit coded vector defined by PCa, PCb, PCc, PCd, PCe, and PCi, according to the trellis diagram of FIG. 22 and the tables shown in FIGS. 14 and 24. The signal PCMPLS6 comes from the disparity control circuit shown in FIG. 25B. This signal is used to invert the primary coded vector abcdei to create the alternate coded vector (abcdei)'. This inversion is performed according to disparity rules.

The bit encoding for K2 is unchanged from data mode. However, the equation for the encoding for bit "i" is slightly changed because the value of K attached to the uncoded vector value '01000' may now be a one which would prevent the i-bit from being forced to one. The added term "+A'" is shown in brackets in the revised equation below:

$$i = C' \cdot D' \cdot E' \cdot (K'\{+A'\}) + A' \cdot B' \cdot C' \cdot D' + A' \cdot B' \cdot E' \cdot (C \neq D) + A \neq B \cdot C \cdot D$$

This equation is equivalent to:

$$i = C' \cdot D' \cdot E' \cdot (K \cdot A)' + A' \cdot B' \cdot C' \cdot D' + A' \cdot B' \cdot E' \cdot (C \neq D) + A \cdot B \cdot C \cdot D$$

5. Disparity Control for 10B/12B Format

Because of the expanded set of 6B control vectors, the disparity controls have to be modified and some circuit simplifications are not applicable. In the equation for PDRS6, the last term E'·K must be expanded to K·A·B·C'·D'·E' to identify the K2 vector.

$$PDRS6 = E' \cdot (A \neq B) \cdot (C \neq D) + A' \cdot (B \neq C) \cdot (D \neq E) + B' \cdot C' \cdot E \cdot (A \neq D) + K \cdot A \cdot B \cdot C' \cdot D' \cdot E'$$

The vector K2 is an addition to the set of vectors which require a negative entry disparity. Within the limited set of the table shown in FIG. 24, it can be identified by the term A'·C'·E'·K, surrounded by brackets, and so the equation for the required negative entry disparity becomes:

$$NDRS6 = A \cdot B \cdot C \cdot D' + C \cdot D \cdot E \cdot (A \neq B) + A \cdot B \cdot C' \cdot D \cdot E + \{A' \cdot C' \cdot E' \cdot K\}$$

The vector K2 is also an addition to the set of balanced S6 vectors:

$$BALS6 = (D \neq E) \cdot (A \oplus B \oplus C)' + D \cdot E \cdot (A \oplus B \oplus C) + A' \cdot B' \cdot D' \cdot E' + C' \cdot D' \cdot E' \cdot K' + A \cdot B \cdot C \cdot E' + \{A' \cdot C' \cdot E' \cdot K\}$$

6. 6B/5B-T Decoding of 12B Format

Figure 26A:
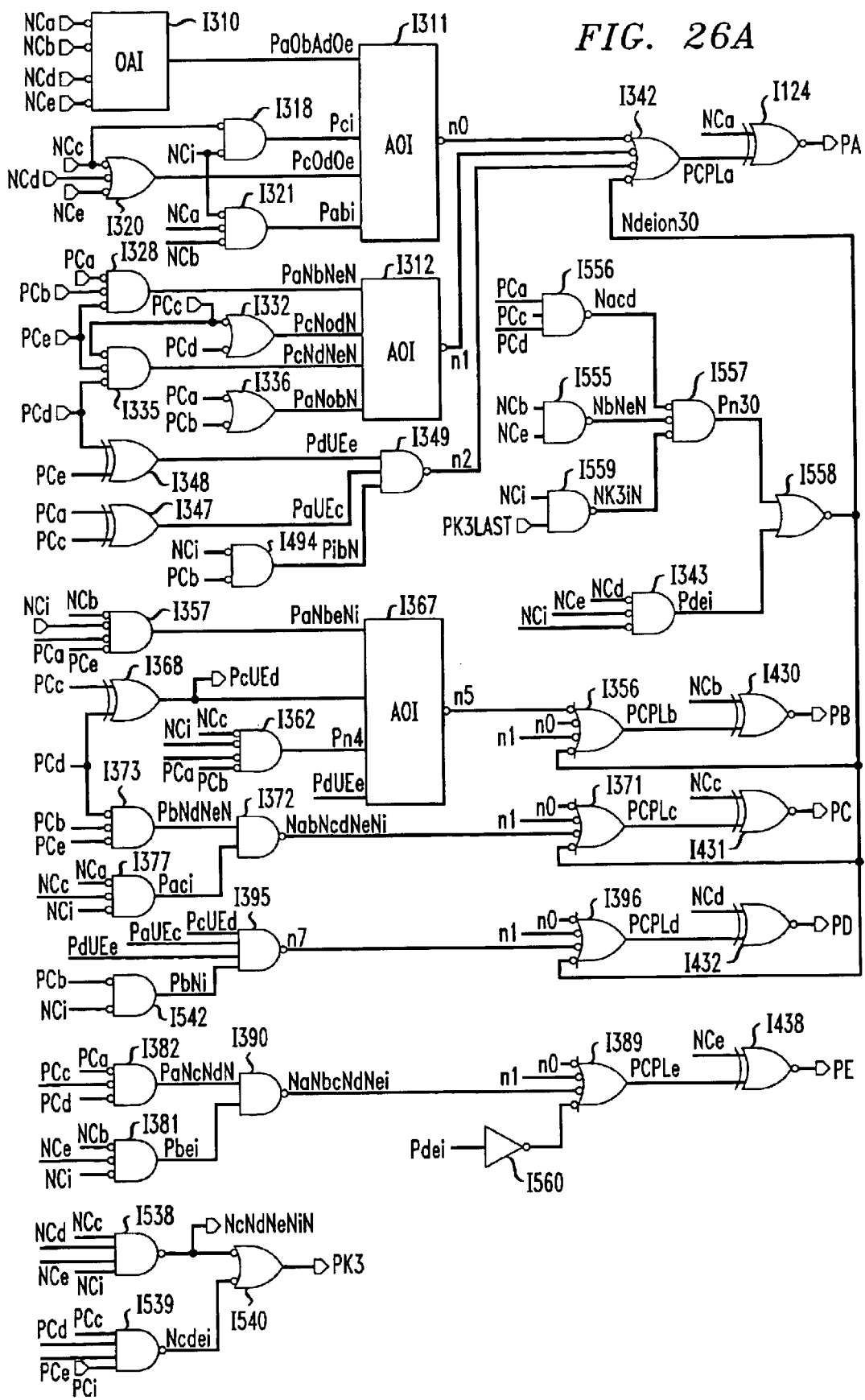
FIG. 26A is a circuit diagram of the 6B/5B-T decoding portion of the 12B/10B decoding circuit.
Figure 26B:
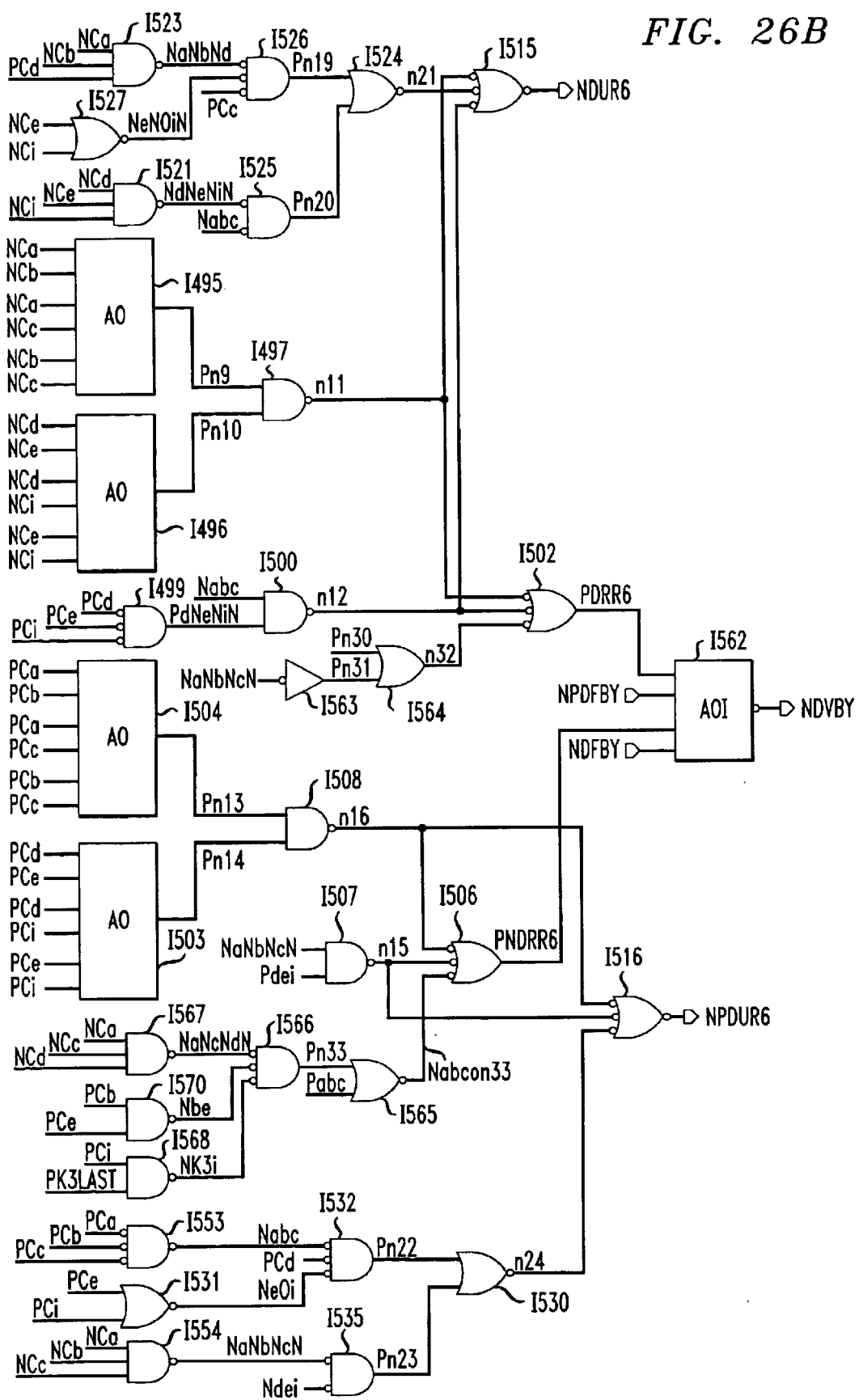
FIG. 26B is a circuit diagram of the disparity and error checking portion of the 12B/10B decoding circuit.
Figure 26B:
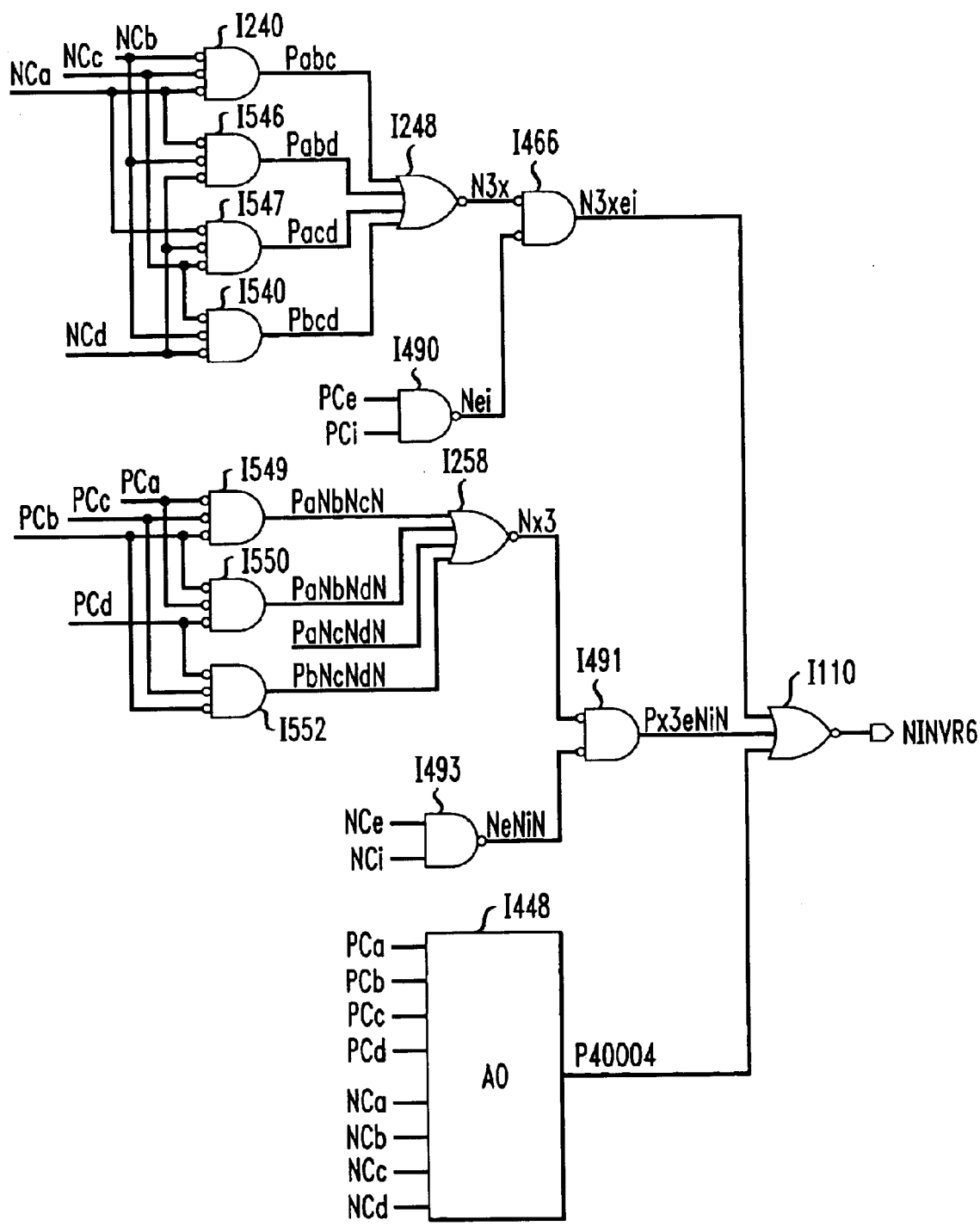

FIGS. 26A and 26B show a 12B/10B bit decoding circuit and a disparity and error checking circuit, respectively, of the 12B/10B decoding circuit. The bit decoding circuit of FIG. 26A takes a six-bit coded vector defined by PCa, PCb, PCc, PCd, PCe, and PCi and produces a five-bit source vector defined by PA, PB, PC, PD, and PE. The AO blocks I495, I496, I504, I503, and I448 and AOI blocks I311 and I367 are AND-OR and AND-OR-INVERT blocks, respectively, as described above in reference to FIGS. 9A and 9B.

The alternate vector for K2 "101100" is normally decoded to D13=1*0*1*1*0 in the B6 format, but if the preceding 6B vector is K3, then it is decoded to D2=01000, i.e., the first four bits are complemented. Since the alternate 6B vector for D/K18 "101101" is decoded to D18=0*1*0*0*1*, i.e., the first four bits are also complemented, one can specify that the first four bits are complemented if (K3LAST·a·b'·c·d·e') is true. The "i" bit can be ignored. However, because the full logic term including i' is required for the function PDRR6 below, the implementation does not make use of the possible simplification for applications which require disparity checks.

Therefore:

$$CMPLa = CMPL5 + b' \cdot i \cdot (a \neq c) \cdot (d \neq e) \{+K3LAST \cdot a \cdot b' \cdot c \cdot d \cdot e' \cdot i'\}$$

$$CMPLb = CMPL5 + a' \cdot b' \cdot e' \cdot i \cdot (c \neq d) + a' \cdot b' \cdot c \cdot i \cdot (d \neq e) \{+K3LAST \cdot a \cdot b' \cdot c \cdot d \cdot e' \cdot i'\}$$

$$CMPLc = CMPL5 + a \cdot b' \cdot c \cdot d' \cdot e' \cdot i \{+K3LAST \cdot a \cdot b' \cdot c \cdot d \cdot e' \cdot i'\}$$

$$CMPMd = CMPL5 + b' \cdot i \cdot (a \neq c) \cdot (c \neq d) \cdot (d \neq e) \{+K3LAST \cdot a \cdot b' \cdot c \cdot d \cdot e' \cdot i'\}$$

In the circuit diagram shown in FIG. 26A, the net name n30 stands for K3LAST·a·b'·c·d·e'·i', and n0=a·b·i·(c+d+e)+c·i·(a+b)·(d+e).

7. Disparity Checks

For the limited set of control characters implemented, the primary vector K2=010011 and the alternate vector K2=101100 require a negative and positive entry disparity, respectively, when following K3. So the positive required front end disparity PDRR6 is augmented by the term:

$$K3LAST \cdot a \cdot b' \cdot c \cdot d \cdot e' \cdot i' = n30$$

The equation for the positive required front end disparity PDRR6 must include n30:

$$PDRR6 = a' \cdot b' \cdot c' + d' \cdot e' \cdot i' \cdot (a \cdot b \cdot c)' + (a' \cdot b' + a' \cdot c' + b' \cdot c') \cdot (d' \cdot e + d' \cdot i + e' \cdot i') + n30$$

The negative required front end disparity NDRR6 is augmented by the term:

$$K3LAST \cdot a' \cdot b \cdot c' \cdot d' \cdot e \cdot i = n33$$

The equation for the negative required front end disparity NDRR6 must include n33:

$$NDR6 = a \cdot b \cdot c + d \cdot e \cdot i \cdot (a + b + c) + (a \cdot b + a \cdot c + b \cdot c) \cdot (d \cdot e + d \cdot i + e \cdot i) + n33$$

More validity checks could be implemented in the 12B domain, especially with regard to invalid control character combinations. It is expected that most applications will not need those checks since most applications are expected to be focused on 5B/6B-T code and will use the 12B format only for start-up and special conditions. In other applications with multiple parallel lanes with error correction, the disparity checks at the receiver can be dispensed of because such errors are detected by other means.

8. Pipe-Lined Versions of Encoder and Decoder Circuits

Staggering the timing for the 6B and 4B parts with a few additional circuits to relieve timing and latency problems has been described above. If that simple solution is not enough, the individual circuits may have to be executed in two (or more) steps which adds latency and a modest amount of extra circuits.

For some applications such as very high speed parallel busses, a pipe-lined structure is preferable over several parallel CoDecs multiplexed into a line to overcome circuit delay problems. In this context, pipe-lining involves taking two basic clock intervals to obtain the coded or decoded results by inserting latches at suitable nodes. In the circuit diagram of the encoder shown in FIG. 9A, the six signals Nba through Pi at the upper center might by stored in a latch and the Exclusive OR function is then performed in the next clock cycle. To best exploit this technique, all circuits should be reevaluated. In the example cited, the signal path to Pi is longer than the encoding circuits for the other five bits because of the A02222 gate which can be decomposed into two parallel A0122 gates which are then combined by a NOR2 gate in the next cycle at the cost of an extra latch. In the lower right quadrant of the diagram, the signals PS1aGH, PS2aGH, PFGHKy, NF, and PGnHn can be latched for comparable circuit delays in the two cycles.

For another example of circuit changes in the pipe-lined version refer to the circuit shown in FIG. 9B in the upper right quadrant. The signals Pn1, Pn2, and Pn3 are all gated by a common input PDFS6 to eliminate a gating level. In the pipe-lined version with less critical timing, this gating function might be applied to the signal Pn1on2on3 instead, which then provides a larger margin for the signal PDFS6.

Generally, the pipe-lined version also provides more freedom to choose signal polarities for minimum delay since an inversion can easily be executed as part of the latch function with a lesser penalty than with the insertion of inverters. Sometimes this may also help to eliminate a gating level otherwise dictated by polarity considerations.

It is to be understood that the embodiments and variations shown and described herein are merely illustrative of the principles of this invention and that various modifications may be implemented by those skilled in the art without departing from the scope and spirit of the invention.

What is claimed is:

1. A 5B/6B encoder suitable for operating on source vectors having five source bits from a plurality of source vectors, the encoder operative in a first step to translate the plurality of source vectors to a plurality of six-bit vectors by appending a sixth bit having a default value to the source vectors and in a second step to generate primary six-bit coded vectors by complementation of selected one to four individual bits of selected six-bit vectors for a minority of the plurality of source vectors, wherein the coded vectors are disparity independent with a single representation or disparity dependent with a primary and an alternate representation, and wherein the alternate representation is a complement of the primary representation.

2. An encoder according to claim 1, wherein the minority of the six-bit vectors with individual bit chances comprises less than half of the plurality of source vectors.

3. An encoder according to claim 2, wherein the minority of six-bit vectors comprises nine six-bit vectors, wherein there are 33 six-bit vectors in the plurality of six-bit vectors, and wherein there are 33 coded primary vectors in the plurality of coded vectors, and wherein one of the six-bit vectors is determined using one of the five-bit source vectors and a value for a control bit K.

4. An encoder according to claim 1, further comprising a control input, the encoder further operative to generate, when the control input is asserted in parallel with a given data vector, an additional coded vector with a trailing run length different from trailing run lengths of all of the other coded vectors.

5. An encoder according to claim 1, wherein the encoder is further operative to generate nine disparity independent coded vectors and 15 disparity dependent primary coded vectors solely by appending a bit with a specified default value to selected source vectors.

6. An encoder according to claim 5, wherein the appended bit has a value of zero and wherein the encoder is further operative to generate the nine disparity independent balanced coded vectors from a set of source vectors that have a disparity of plus one and no more than one trailing zero.

7. An encoder according to claim 5, wherein the appended bit has a value of zero, wherein one of the disparity dependent primary coded vectors is balanced, and wherein the encoder is further operative to generate the one balanced disparity dependent primary coded vector from a source vector having a disparity of plus one and three leading ones.

8. An encoder according to claim 5, wherein the appended bit has a value of zero, wherein four of the disparity dependent primary coded vectors have a disparity of plus two, and wherein the encoder is further operative to generate four disparity dependent primary coded vectors with a disparity of plus two from source vectors having a disparity of plus three and one trailing one.

9. An encoder according to claim 5, wherein the appended bit has a value of zero, wherein ten of the disparity dependent primary coded vectors have a disparity of minus two, and wherein the encoder is further operative to generate the ten disparity dependent primary coded vectors from source vectors with a disparity of minus one.

10. An encoder according to claim 1, wherein the encoder is further operative to generate nine disparity independent balanced coded vectors by appending a bit with a default value and complementation of one to four bits for selected six-bit vectors.

11. An encoder according to claim 10, wherein the default value of the appended bit is complemented to a value of one, wherein the nine disparity independent coded vectors are balanced, and wherein the encoder is further operative to generate the nine balanced disparity independent coded vectors from a set of source vectors with a disparity of minus one and no more than one trailing one.

12. A method for translating source vectors having five source bits into six-bit coded vectors, wherein each source vector is selected from a plurality of source vectors, the method comprising the steps of:

appending a sixth bit having a default value to the source vectors to create a plurality of six-bit vectors; and generating primary six-bit coded vectors by complementing selected one to four individual bits of selected six-bit vectors for a minority of the plurality of source vectors;

wherein the coded vectors are disparity independent with a single representation or disparity dependent with a primary and an alternate representation, and wherein the alternate representation is a complement of the primary representation.

13. A 3B/4B encoder suitable for operating on source vectors having three source bits, the source vectors from a plurality of source vectors, the encoder operative to translate source vectors, together with one or more control inputs, into one of nine four-bit coded vectors by appending a fourth bit having a default value to the source vectors to create four-bit vectors and by complementing one or two individual bits of selected four-bit vectors for a minority of the plurality of source vectors, wherein the coded vectors are disparity independent with a single representation or disparity dependent with a primary and an alternate representation, and wherein the alternate representation is a complement of the primary representation.

14. An encoder according to claim 13, farther operative to assign a second primary coded vector to a source vector of '111,' wherein the encoder assigns the second primary coded vector only when a first primary coded vector would generate a false comma sequence or when a given one of the one or more control inputs is asserted.

15. An encoder according to claim 14, wherein the encoder is further operative, when determining a coded vector corresponding to a given four-bit vector, to complement the default value of the appended bit to a value of one if two trailing source bits in a corresponding source vector are both zero or if the second primary coded vector is to be encoded.

16. An encoder according to claim 14, wherein the encoder is further operative, when determining a given coded vector corresponding to a given four-bit vector, to leave the appended bit at a value of zero for the given coded vector if at least one of two trailing source bits in a corresponding source vector is a one and if the second primary vector is not to be encoded.

17. An encoder according to claim 14, wherein the encoder is further operative, when determining a coded vector corresponding to a given four-bit vector, to complement the first source bit to zero in the given four-bit vector if the second primary vector is to be encoded.

18. An encoder according to claim 13, wherein the encoder is further operative, when determining a given coded vector corresponding to a given four-bit vector, to complement a second bit in the given four-bit vector to one if all three source bits in a corresponding source vector have a value of zero.

19. An encoder according to claim 13, wherein the encoder is further operative to complement four primary coded vectors which are balanced and otherwise disparity independent if a running disparity is positive and a given one of the one or more control inputs is asserted.

20. A method for translating source vectors having three source bits into four-bit coded vectors, wherein each source vector is selected from a plurality of source vectors, the method translating source vectors, together with one or more control inputs, into one of nine four-bit coded vectors, the method comprising the steps of:
appending a fourth bit having a default value to the source vectors to create a plurality of four-bit vectors; and
complementing one or two individual source bits of selected four-bit vectors for a minority of source vectors,
wherein the coded vectors are disparity independent with a single representation or disparity dependent with a primary and an alternate representation, and wherein the alternate representation is a complement of the primary representation.

21. A partitioned 8B/10B encoder comprising:
at least one control input;
a 3B/4B encoder, coupled to the at least one control input, suitable for operating on three-bit source vectors having three source bits, the three-bit source vectors from a plurality of three-bit source vectors, the 3B/4B encoder operative to translate three-bit source vectors, together with information from the at least one control input, into one of nine four-bit coded vectors by appending a fourth bit with a default value to the three-bit source vectors to create a plurality of four-bit vectors and by complementing one or two individual source bits of selected four-bit vectors for a minority of three-bit source vectors, wherein the four-bit coded vectors are disparity independent with a single representation or disparity dependent with a primary and an alternate representation, wherein the alternate representation is a complement of the primary representation, wherein the 3B/4B encoder is further operative to assign a second primary four-bit coded vector to a three-bit source vector of '111,' and wherein the 3B/4B encoder assigns the second primary four-bit coded vector only when a first primary four-bit coded vector would generate a false comma sequence or when the at least one control input is asserted; and
a 5B/6B encoder, coupled to the 3B/4B encoder and the at least one control input, suitable for operating on five-bit source vectors, each having five source bits, the five-bit source vectors from a plurality of five-bit source vectors, the 5B/6B encoder operative in a first step to translate five-bit source vectors from a plurality of five-bit source vectors into a plurality of six-bit vectors by appending a sixth bit having a default value to the five-bit source vectors and in a second step to generate primary six-bit coded vectors by complementation of selected one to four individual bits of selected six-bit vectors for a minority of the plurality of five-bit source vectors, wherein the six-bit coded vectors are disparity independent with a single representation or disparity dependent with a primary and an alternate representation;
wherein the 8B/10B encoder is operative to determine a set of control characters by using the second primary four-bit coded vector in situations that do not require the second primary four-bit coded vector for false comma avoidance in combination with selected balanced six-bit coded vectors that are made disparity dependent in response to at least one asserted control input of the at least one control inputs.

22. A 10B/12B encoder comprising a pair of 5B/6B encoders, each of which operates on five-bit source vectors to produce six-bit coded vectors, wherein the 10B/12B encoder is operative to generate a first set of control characters, the control characters in the first set being characterized by a first leading and first trailing coded vector from the pair of 5B/6B encoders and by a trailing run of 4 in the first leading coded vector followed by the first trailing code vector that is one of 13 unbalanced coded vectors or one of 15 balanced vectors that do not generate a run of six when following the first leading coded vector.

23. A 10B/12B encoder according to claim 22, wherein the 10B/12B encoder is further operative to generate a second set of control characters, the control characters in the second set characterized by second leading and second trailing coded vectors and by a leading run of 4 in the second trailing coded vector, preceded by a second leading coded vector that is one of 13 unbalanced coded vectors or one of 15 balanced vectors that do not generate a run of six when preceding a run of four occurs in the second leading coded vector.

24. A 10B/12B encoder according to claim 23, wherein the 10B/12B encoder comprises a control input and wherein the balanced vectors are made disparity dependent when the control input is asserted.

25. A 10B/12B encoder according to claim 22, wherein the 10B/12B encoder is operative:

to determine a starting disparity; and to generate a synchronizing coded pattern based on the starting disparity;

wherein the synchronizing coded pattern is "110010 000011" for a positive starting disparity and "001101 111100" for a negative starting disparity.

26. A method for generating control characters when operating on pairs of five-bit source vectors to produce pairs of six-bit coded vectors for a 10B/12B code, the method comprising the step of:

generating a first set of control characters, the control characters in the first set being characterized by a first leading and first trailing coded vector from a pair of six-bit coded vectors and by a trailing run of four in the first leading coded vector followed by the first trailing code vector that is one of 13 unbalanced coded vectors or one of 15 balanced vectors that do not generate a run of six when following the first leading coded vector.

27. A method according to claim 26, further comprising the step of generating a second set of control characters, the control characters in the second set characterized by second leading and second trailing coded vectors and by a leading run of 4 in the second trailing coded vector, preceded by a second leading coded vector that is one of 13 unbalanced coded vectors or one of 15 balanced vectors that do not generate a run of six when preceding a run of four occurs in the second leading coded vector.

* * * * *

UNITED STATES PATENT AND TRADEMARK OFFICE
CERTIFICATE OF CORRECTION

PATENT NO. : 6,911,921 B2
DATED : June 28, 2005
INVENTOR(S) : Widmer

It is certified that error appears in the above-identified patent and that said Letters Patent is hereby corrected as shown below:

Column 1,
Line 23, before "transmission" and after "partitioned" replace "8B/00B" with
-- 8B/10B --.

Column 5,
Line 22, replace "D16      0* 0 0 0 0" with -- D16      0* 0 0 0 1 --.

Column 6,
Line 47, replace "$S1=PDFS6 \cdot C \cdot D \cdot E' \cdot (A \neq D)$" with -- $S1= PDFS6 \cdot C \cdot D \cdot E' \cdot (A \neq B)$ --.
Line 59, replace "$S2=NDFS6 \cdot A' \cdot C' \cdot D' \cdot (8 \neq E)$" with
-- $S2=NDFS6 \cdot A' \cdot C' \cdot D' \cdot (B \neq E)$ --.

Column 7,
Line 20, replace
"$f=F'+G \cdot H \cdot S1+G \cdot H \cdot S2+G \cdot H \cdot K \cdot E$" with -- $f'=F'+G \cdot H \cdot S1+G \cdot H \cdot S2+G \cdot H \cdot K \cdot E$ --.
Lines 22-23, replace
"$f=F'+G \cdot H \cdot C \cdot D \cdot E' \cdot (A \neq B) \cdot PDFS6+G \cdot H \neq A' \cdot C' \cdot D' \cdot (B \neq E) \cdot NDFS6+$ $G \cdot H \cdot K \cdot E$" with
-- $f'=F'+G \cdot H \cdot C \cdot D \cdot E' \cdot (A \neq B) \cdot PDFS6+G \cdot H \cdot A' \cdot C' \cdot D' \cdot (B \neq E) \cdot NDFS6+G \cdot H \cdot K \cdot E$ --.

Column 9,
Line 20, replace "$PDRS6=E' \cdot (A \neq B) \cdot (C \neq D)+A' \cdot (B \neq C) \cdot (D \neq E)+B' \cdot C' \cdot E \cdot (A \neq D)+E \neq K$"
with -- $PDRS6=E' \cdot (A \neq B) \cdot (C \neq D)+A' \cdot (B \neq C) \cdot (D \neq E)+B' \cdot C' \cdot E \cdot (A \neq D)+E \cdot K$ --.
Line 32, replace "D/K30      0 1 1 1" with -- D/K30      0 1 1 1 1 --.
Line 34, after "The vectors D7 and D/K23 can be identified by" replace "$A \cdot B \cdot C \cdot D \cdot$."
with -- $A \cdot B \cdot C \cdot D'$. --.
Line 40, replace "MDRS6 =" with -- NDRS6 = --.

Column 10,
Line 42, replace "$WB6=A \infty \cdot B' \cdot D' \cdot E'$." with -- $WB6=A' \cdot B' \cdot D' \cdot E'$. --.

Column 14,
Line 40, replace "D/K230" with -- D/K23 --.
Line 41, replace "D/K270" with -- D/K27 --.

Column 15,
Line 13, replace "$n5=a' \cdot b \cdot e' \cdot i \cdot (c \neq d)+a' \cdot b' \cdot c \neq i \neq (d \neq e)$" with
-- $n5=a' \cdot b \cdot e' \cdot i \cdot (c \neq d)+a' \cdot b' \cdot c \cdot i \cdot (d \neq e)$ --.
Line 25, replace "$CMPLe=CMPL5+a' \cdot b \cdot c' \cdot d' \cdot e \neq i$" with
-- $CMPLe=CMPL5+a' \cdot b \cdot c' \cdot d' \cdot e \cdot i$ --.

UNITED STATES PATENT AND TRADEMARK OFFICE
CERTIFICATE OF CORRECTION

PATENT NO. : 6,911,921 B2
DATED : June 28, 2005
INVENTOR(S) : Widmer

It is certified that error appears in the above-identified patent and that said Letters Patent is hereby corrected as shown below:

Column 15 (cont'd),
Line 47, before "used" and after "are" delete "use".

Column 17,
Line 67, replace "$n19=a'\bullet b'\bullet c'\bullet d\bullet(e\infty+i')$" with -- $n19=a'\bullet b'\bullet c'\bullet d\bullet(e'+i')$ --.

Column 19,
Line 39, replace "$CMPLg=(c'\bullet d'\bullet e'\bullet i')\bullet(f\neq g)\bullet(h\neq j)\neq(f\bullet h)'+g'\bullet h\bullet j+g\bullet h'\bullet j+(f\neq j)\bullet g'\bullet$" with
-- $CMPLg=(c'\bullet d'\bullet e'\bullet i')\bullet(f\neq g)\bullet(h\neq j)\bullet(f\bullet h)'+g'\bullet h\bullet j+g\bullet h'\bullet j+(f\neq j)\bullet g'$ --.

Colum 20,
Line 67, after "Where" replace "$P22=(a\neq b)\bullet(e\neq d)+(a=b)\bullet(c=d)\bullet(b\neq c)$" with
-- $P22=(a\neq b)\bullet(c\neq d)+(a=b)\bullet(c=d)\bullet(b\neq c)$ --.

Column 21,
Line 60, replace "PDFBY=PDUBY_LAST+PDFBY_LAST•NDUBY_LAST" with
-- PDFBY=PDUBY_LAST+PDF$\overline{Y}$_LAST•NDUBY_LAST' --.

Column 22,
Line 30, replace "PDFBY0=PDUBY3_LAST+PDFBY3_LAST•NDUBY3_LAST" with
-- PDFBY0=PDUBY3_LAST+PDFBY3_LAST•NDUBY3_LAST' --.
Line 31, replace "NDFBY0=NDUBY3_LAST+NDFBY3_LAST•PDUB3Y3_LAST"
with -- NDFBY0=NDUBY3_LAST+NDFBY3_LAST•PDUBY3_LAST' --.

Column 23,
Line 10, replace "PNDFBYL=PDFBY1'" with -- PNDFBY1=PDFBY1' --.

Column 25,
Line 48, replace "$i=C'\bullet D'\bullet E'\bullet(K\bullet A)'+A'\bullet B'\bullet C'\bullet D'+A'\bullet B'\bullet E'\bullet(C\neq D)+A\neq B\bullet C\bullet D$" with
-- $i=C'\bullet D'\bullet E'\bullet(K\bullet A)'+A'\bullet B'\bullet C'\bullet D'+A'\bullet B'\bullet E'\bullet(C\neq D)+A\bullet B\bullet C\bullet D$ --.

Column 28,
Line 2, before "wherein" delete "and".

UNITED STATES PATENT AND TRADEMARK OFFICE
CERTIFICATE OF CORRECTION

PATENT NO. : 6,911,921 B2
DATED : June 28, 2005
INVENTOR(S) : Widmer

It is certified that error appears in the above-identified patent and that said Letters Patent is hereby corrected as shown below:

Column 29,
Line 14, before "operative" and after "claim 13" replace "farther" with -- further --.

Signed and Sealed this

First Day of November, 2005

JON W. DUDAS
*Director of the United States Patent and Trademark Office*